(12) United States Patent
Huang

(10) Patent No.: US 11,699,661 B2
(45) Date of Patent: Jul. 11, 2023

(54) METHOD FOR FABRICATING SEMICONDUCTOR DEVICE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 130 days.

(21) Appl. No.: 17/398,327

(22) Filed: Aug. 10, 2021

(65) Prior Publication Data
US 2021/0375763 A1 Dec. 2, 2021

Related U.S. Application Data

(62) Division of application No. 16/561,489, filed on Sep. 5, 2019.

(51) Int. Cl.
| H01L 21/311 | (2006.01) |
| H01L 21/768 | (2006.01) |
| H01L 21/02 | (2006.01) |
| H01L 23/532 | (2006.01) |
| H01L 23/528 | (2006.01) |
| H10B 12/00 | (2023.01) |

(52) U.S. Cl.
CPC .... *H01L 23/5329* (2013.01); *H01L 21/31144* (2013.01); *H01L 21/76831* (2013.01); *H01L 21/76834* (2013.01); *H01L 21/76877* (2013.01); *H01L 23/528* (2013.01); *H10B 12/0335* (2023.02); *H10B 12/053* (2023.02); *H10B 12/315* (2023.02); *H10B 12/34* (2023.02); *H10B 12/482* (2023.02); *H10B 12/485* (2023.02); *H10B 12/488* (2023.02); *H01L 21/0217* (2013.01); *H01L 21/0228* (2013.01); *H01L 21/02164* (2013.01); *H01L 21/02175* (2013.01); *H01L 21/02178* (2013.01); *H01L 21/02181* (2013.01); *H01L 21/02186* (2013.01); *H01L 21/02189* (2013.01); *H01L 21/02205* (2013.01); *H01L 21/02208* (2013.01)

(58) Field of Classification Search
None
See application file for complete search history.

(56) References Cited

U.S. PATENT DOCUMENTS

| 6,255,168 B1 | 7/2001 | Gau |
| 6,429,476 B2 | 8/2002 | Suzuki et al. |
| 8,344,434 B2 | 1/2013 | Wang et al. |
| 9,007,818 B2 | 4/2015 | Sandhu et al. |
| 9,972,626 B1 | 5/2018 | Takesako et al. |

(Continued)

FOREIGN PATENT DOCUMENTS

| TW | 201344886 A | 11/2013 |
| TW | 201911584 A | 3/2019 |

*Primary Examiner* — Evren Seven
(74) *Attorney, Agent, or Firm* — Muncy, Geissler, Olds & Lowe, P.C.

(57) ABSTRACT

The present application discloses a method for fabricating the semiconductor device. The method for fabricating a semiconductor device includes providing a substrate having a first lattice constant and forming a first word line positioned in the substrate and a plurality of stress regions positioned adjacent to lower portions of sidewalls of the first word line. The plurality of stress regions have a second lattice constant, the second lattice constant of the plurality of stress regions is different from the first lattice constant of the substrate.

8 Claims, 33 Drawing Sheets

(56) References Cited

U.S. PATENT DOCUMENTS

| | | |
|---|---|---|
| 2005/0026383 A1 | 2/2005 | Shau |
| 2008/0164502 A1 | 7/2008 | Fukumoto et al. |
| 2013/0052780 A1 | 2/2013 | Kim et al. |
| 2013/0288472 A1 | 10/2013 | Choi et al. |
| 2014/0264568 A1 | 9/2014 | Kim et al. |
| 2014/0291754 A1 | 10/2014 | Lee et al. |
| 2016/0093631 A1 | 3/2016 | Yun et al. |
| 2016/0181385 A1 | 6/2016 | Kim et al. |
| 2016/0322422 A1 | 11/2016 | Yokoyama et al. |
| 2016/0351711 A1 | 12/2016 | Bae et al. |
| 2017/0103995 A1 | 4/2017 | Hatano et al. |
| 2018/0158826 A1 | 6/2018 | Cho et al. |
| 2018/0358442 A1 | 12/2018 | Rao |
| 2019/0006241 A1 | 1/2019 | Yang et al. |
| 2019/0214455 A1 | 7/2019 | Kang et al. |
| 2021/0057578 A1 | 2/2021 | Huang |

METHOD FOR FABRICATING SEMICONDUCTOR DEVICE

CROSS-REFERENCE TO RELATED APPLICATION

This application is a divisional application of U.S. Non-Provisional application Ser. No. 16/561,489 filed Sep. 5, 2019, which is incorporated herein by reference in its entirety.

TECHNICAL FIELD

The present disclosure relates to a method for fabricating a semiconductor device, and more particularly, to a method for fabricating a semiconductor device with stress regions.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved performance, quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device includes a substrate having a first lattice constant, a first word line positioned in the substrate, and a plurality of stress regions positioned adjacent to lower portions of sidewalls of the first word line. The plurality of stress regions have a second lattice constant, the second lattice constant of the plurality of stress regions is different from the first lattice constant of the substrate.

In some embodiments, bottoms of the plurality of stress regions are at a vertical level lower than a vertical level of a bottom of the first word line.

In some embodiments, the first word line comprises a first word line trench, a first word line insulating layer, a first word line electrode, and a first word line capping layer, the first word line trench is positioned in the substrate, the first word line insulating layer covers an inner surface of the first word line trench, the first word line electrode is positioned on the first word line insulating layer in the first word line trench, the first word line capping layer is positioned on the first word line electrode in the first word line trench, the plurality of stress regions are respectively correspondingly positioned attached to lower portions of sidewalls of the first word line insulating layer.

In some embodiments, the vertical level of the plurality of stress regions is lower than the vertical level of the bottom of the first word line about 0.5 nm to about 500 nm.

In some embodiments, the first word line capping layer is formed of a single layer comprising an insulating material having a dielectric constant of about 4.0 or greater.

In some embodiments, the first word line capping layer is formed of a stacked layer comprising a bottom capping layer and a top capping layer, the bottom capping layer is positioned on the first word line electrode, the top capping layer is positioned on the bottom capping layer, the bottom capping layer is formed of hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, or barium strontium titanate, the top capping layer is formed of silicon oxide, silicon nitride, silicon oxynitride, silicon nitride oxide, or fluoride-doped silicate.

In some embodiments, sidewalls of the first word line capping layer directly contacts an upper portion of an inner surface of the first word line insulating layer.

In some embodiments, sidewalls of the first word line capping layer directly contact an upper portion of the inner surface of the first word line trench.

In some embodiments, a bottom of the first word line trench is flat.

In some embodiments, the semiconductor device further comprises a bit line above the substrate.

In some embodiments, the semiconductor device further comprises a bit line above the substrate, wherein the bit line comprises a bit line opening, a bit line contact, a bit line bottom electrode, a bit line top electrode, a bit line mask, and a plurality of bit line spacers, the bit line opening is positioned in the substrate, the bit line contact is positioned in the bit line opening, sidewalls of the bit line contact are distanced from sidewalls of the bit line opening, the bit line bottom electrode is positioned on the bit line contact, the bit line top electrode is positioned on the bit line bottom electrode, the bit line mask is positioned on the bit line top electrode, the plurality of bit line spacers respectively cover sidewalls of the bit line mask, sidewalls of the bit line top electrode, sidewalls of the bit line bottom electrode, and the sidewalls of the bit line contact.

Another aspect of the present disclosure provides a method for fabricating a semiconductor device including providing a substrate having a first lattice constant and forming a first word line positioned in the substrate and a plurality of stress regions positioned adjacent to lower portions of sidewalls of the first word line. The plurality of stress regions have a second lattice constant, the second lattice constant of the plurality of stress regions is different from the first lattice constant of the substrate.

In some embodiments, bottoms of the plurality of stress regions are at a vertical level lower than a vertical level of a bottom of the first word line.

In some embodiments, the first word line comprises a first word line trench, a first word line insulating layer, a first word line electrode, and a first word line capping layer, the first word line trench is positioned in the substrate, the first word line insulating layer covers an inner surface of the first word line trench, the first word line electrode is positioned on the first word line insulating layer in the first word line trench, the first word line capping layer is positioned on the first word line electrode in the first word line trench, the plurality of stress regions are respectively correspondingly positioned attached to lower portions of sidewalls of the first word line insulating layer.

In some embodiments, forming a first word line positioned in the substrate and a plurality of stress regions positioned adjacent to lower portions of sidewalls of the first word line comprises: forming a first word line trench in the substrate; forming a coverage layer covered an upper portion of an inner surface of the first word line trench; forming a bottom mask layer on a bottom of the first word line trench; forming a plurality of side recesses extended outwardly at a lower portion of the inner surface of the first word line trench; forming the plurality of stress regions in the plurality of side recesses; removing the coverage layer and the bottom mask layer; forming a first word line insulating layer covered the inner surface of the first word line trench; forming a first word line electrode on the first word line insulating layer in the first word line trench; and forming a first word line capping layer on the first word line electrode in the first word line trench, wherein the first word line trench, the first word line insulating layer, the first word line electrode, and the first word line capping layer together form the first word line.

In some embodiments, the first word line capping layer is formed of a single layer including an insulating material having a dielectric constant of about 4.0 or greater.

In some embodiments, the first word line capping layer is formed of a stacked layer including a bottom capping layer and a top capping layer, the bottom capping layer is positioned on the first word line electrode, the top capping layer is positioned on the bottom capping layer, the bottom capping layer is formed of hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, or barium strontium titanate, the top capping layer is formed of silicon oxide, silicon nitride, silicon oxynitride, silicon nitride oxide, or fluoride-doped silicate.

In some embodiments, sidewalls of the first word line capping layer directly contacts an upper portion of an inner surface of the first word line insulating layer.

In some embodiments, sidewalls of the first word line capping layer directly contacts an upper portion of the inner surface of the first word line trench.

In some embodiments, a bottom of the first word line trench is flat.

Due to the design of the semiconductor device of the present disclosure, the second lattice constant of the plurality of stress regions is different from the first lattice constant of the substrate; therefore, the carrier mobility of the semiconductor device may be increased; therefore, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
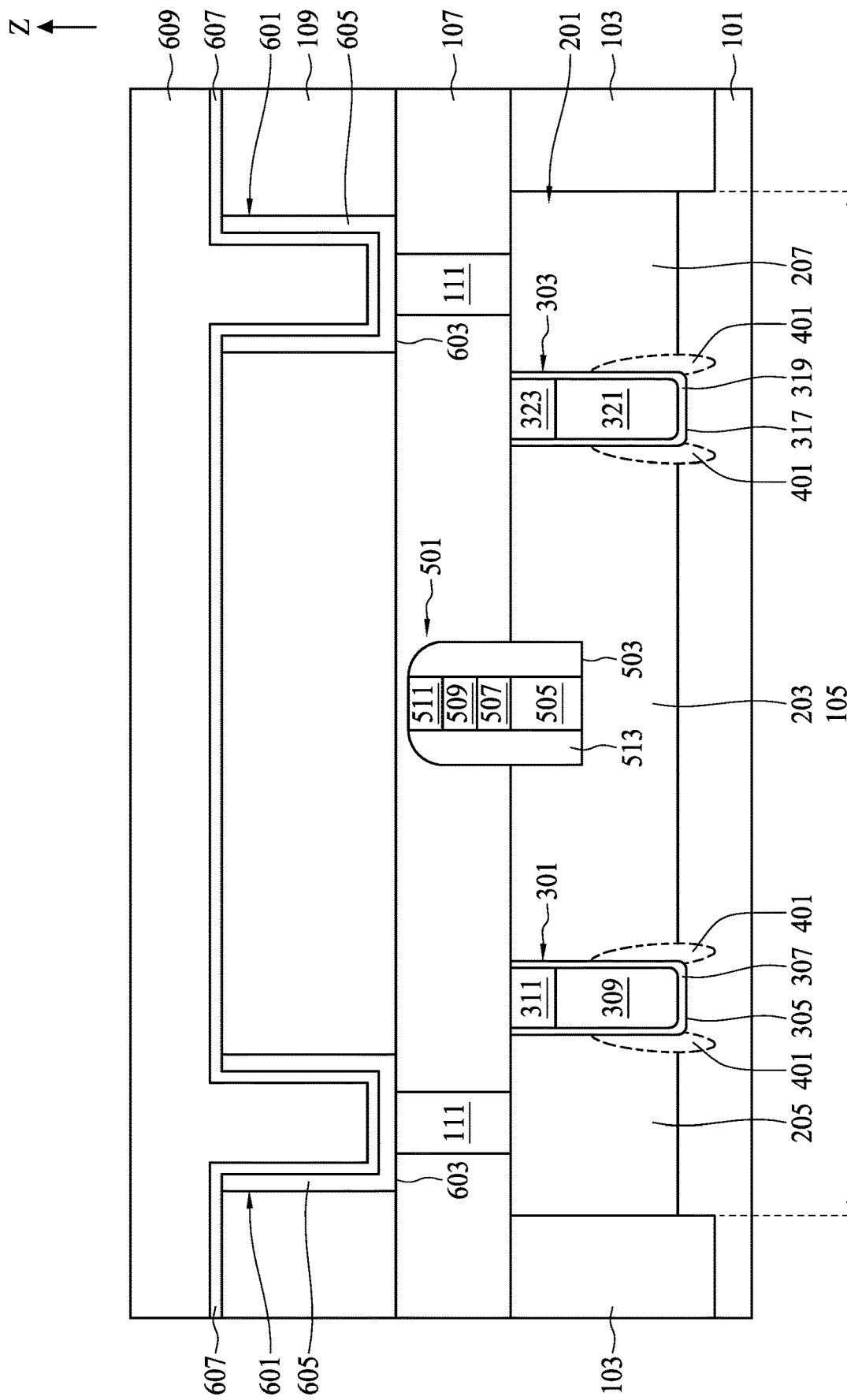
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that when an element or layer is referred to as being "connected to," or "coupled to" another element or layer, it can be directly connected to or coupled to another element or layer or intervening elements or layers may be present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory.

Note that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device in accordance with one embodiment of the present disclosure.

With reference to FIG. 1, the semiconductor device includes a substrate 101, an isolation layer 103, an active region 105, a first insulating film 107, a second insulating film 109, a plurality of conductive plugs 111, a doped region 201, a plurality of word lines, a plurality of stress regions 401, a bit line 501, and a plurality of capacitor structures 601.

With reference to FIG. 1, in the embodiment depicted, the substrate 101 may be formed of, for example, silicon, germanium, silicon germanium, silicon carbon, silicon germanium carbon, gallium, gallium arsenic, indium arsenic, indium phosphorus and all other IV-IV, III-V or II-VI semiconductor materials. The substrate 101 may have a first lattice constant and a crystal orientation <100>. Alternatively, in another embodiment depicted, the substrate 101 may include an organic semiconductor or a layered semiconductor such as silicon/silicon germanium, a silicon-on-insulator or a silicon germanium-on-insulator. When the substrate 101 may be formed of silicon-on-insulator, the substrate 101 may include a top semiconductor layer and a bottom semiconductor layer formed of silicon, and a buried insulating layer which may separate the top semiconductor layer and the bottom semiconductor layer. The buried insulating layer may include, for example, a crystalline or non-crystalline oxide, nitride or any combination thereof.

With reference to FIG. 1, the isolation layer 103 may be disposed in the substrate 101 (Shown two in a schematic cross-sectional view) and define the active region 105 of the substrate 101. The isolation layer 103 may be formed of an insulating material such as silicon oxide, silicon nitride, silicon oxynitride, silicon nitride oxide, or fluoride-doped silicate. Note that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, in the embodiment depicted, the doped region 201 may be disposed in the active region 105 and may be located in an upper portion of the substrate 101. The doped region 201 may be doped by a dopant and have a dopant concentration ranging from 1E17 atoms/cm^3 to about 1E19 atoms/cm^3. The dopant may be phosphorus, arsenic, or antimony. Alternatively, in another embodiment depicted, the dopant may be boron.

With reference to FIG. 1, in the embodiment depicted, a plurality of word lines may be disposed in the active region 105 of the substrate 101. The plurality of word lines may include a first word line 301 and a second word line 303. The first word line 301 may be separated from the second word line 303. The first word line 301 and the second word line 303 may divide the doped region 201 into a first doped region 203, a second doped region 205, and a third doped region 207. The first doped region 203 may be disposed between the first word line 301 and the second word line 303. The second doped region 205 may be disposed between the isolation layer 103 and the first word line 301. The second doped region 205 may be opposite to the first doped region 203 with the first word line 301 interposed therebetween. The third doped region 207 may be disposed between the second word line 303 and the isolation layer 103. The third doped region 207 may be opposite to the first doped region 203 with the second word line 303 interposed therebetween.

With reference to FIG. 1, in the embodiment depicted, the first word line 301 may include a first word line trench 305, a first word line insulating layer 307, a first word line electrode 309, and a first word line capping layer 311. The first word line trench 305 may disposed in the substrate 101. The first word line trench 305 may be disposed between the first doped region 203 and the second doped region 205. A bottom of the first word line trench 305 may be flat. The bottom of the first word line trench 305 may be slightly lower than a bottom of the doped region 201; in other words, the bottom of the first word line trench 305 may be slightly lower than a bottom of the first doped region 203 or a bottom of the second doped region 205. Specifically, the bottom of the first word line trench 305 may be lower than the bottom of the doped region 201 about 0.1 nm to about 50 nm.

With reference to FIG. 1, in the embodiment depicted, the first word line insulating layer 307 may cover an inner surface of the first word line trench 305. The first word line insulating layer 307 may be formed of an insulating material having a dielectric constant of about 4.0 or greater (All dielectric constants mentioned herein are relative to a vacuum unless otherwise noted). The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. A thickness of the first word line insulating layer 307 may be about 0.5 nm to about 10 nm. Alternatively, in another embodiment depicted, the insulating material may be silicon oxide, silicon nitride, silicon oxynitride, silicon nitride oxide, or the like.

With reference to FIG. 1, in the embodiment depicted, the first word line electrode 309 may be disposed on the first word line insulating layer 307 in the first word line trench 305. The first word line electrode 309 may be formed of a conductive material such as polysilicon, silicon germanium, a metal, a metal alloy, a metal silicide, a metal nitride, a metal carbide, or combinations including multilayers thereof. When multilayers are present, a diffusion barrier layer (not shown) such as titanium nitride or tantalum nitride may be disposed between each of the multilayers. The metal may be, for example, aluminum, copper, tungsten, or cobalt. The metal silicide may be, for example, nickel silicide, platinum silicide, titanium silicide, molybdenum silicide, cobalt silicide, tantalum silicide, tungsten silicide, or the like. A thickness of the first word line electrode 309 may be about 50 nm to about 500 nm.

With reference to FIG. 1, in the embodiment depicted, the first word line capping layer 311 may be disposed on the first word line electrode 309 in the first word line trench 305. A top surface of the first word line capping layer 311 may be at a vertical level as the same as a vertical level of a top surface of the substrate 101. Sidewalls of the first word line capping layer 311 may directly contact an upper portion of an inner surface of the first word line insulating layer 307. The first word line capping layer 311 may be formed of a single layer including an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. Alternatively, in another embodiment depicted, the insulating material may be silicon oxide, silicon nitride, silicon oxynitride, silicon nitride oxide, or the like.

With reference to FIG. 1, in the embodiment depicted, the second word line 303 may include a second word line trench 317, a second word line insulating layer 319, a second word line electrode 321, and a second word line capping layer 323. The second word line trench 317 may disposed in the substrate 101. The second word line trench 317 may be disposed between the first doped region 203 and the third doped region 207. A bottom of the second word line trench 317 may be flat. The bottom of the second word line trench 317 may be slightly lower than the bottom of the doped region 201; in other words, the bottom of the second word line trench 317 may be slightly lower than the bottom of the first doped region 203 or a bottom of the third doped region 207. Specifically, the bottom of the second word line trench 317 may be lower than the bottom of the doped region 201 about 0.1 nm to about 50 nm.

With reference to FIG. 1, in the embodiment depicted, the second word line insulating layer 319 may cover an inner surface of the second word line trench 317. The second word line insulating layer 319 may be formed of an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. A thickness of the first word line insulating layer 307 may be about 0.5 nm to about 10 nm. Alternatively, in another embodiment depicted, the insulating material may be silicon oxide, silicon nitride, silicon oxynitride, silicon nitride oxide, or the like. The second word line insulating layer 319 may be formed of the same material as the first word line insulating layer 307 but is not limited thereto.

With reference to FIG. 1, in the embodiment depicted, the second word line electrode 321 may be disposed on the second word line insulating layer 319 in the second word line trench 317. The second word line electrode 321 may be formed of a conductive material such as polysilicon, silicon germanium, a metal, a metal alloy, a metal silicide, a metal nitride, a metal carbide, or combinations including multilayers thereof. When multilayers are present, a diffusion barrier layer (not shown) such as titanium nitride or tantalum nitride may be disposed between each of the multilayers. The metal may be, for example, aluminum, copper, tungsten, or cobalt. The metal silicide may be, for example, nickel silicide, platinum silicide, titanium silicide, molybdenum silicide, cobalt silicide, tantalum silicide, tungsten silicide, or the like. A thickness of the second word line electrode 321 may be about 50 nm to about 500 nm. The second word line electrode 321 may be formed of the same material of the first word line electrode 309 but is not limited thereto.

With reference to FIG. 1, in the embodiment depicted, the second word line capping layer 323 may be disposed on the second word line electrode 321 in the second word line trench 317. A top surface of the second word line capping layer 323 may be at a vertical level as the same as the vertical level of the top surface of the substrate 101. Sidewalls of the second word line capping layer 323 may be directly contact an upper portion of an inner surface of the second word line insulating layer 319. The second word line capping layer 323 may be formed of a single layer including an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. Alternatively, in another embodiment depicted, the insulating material may be silicon oxide, silicon nitride, silicon oxynitride, silicon nitride oxide, or the like. The second word line capping layer 323 may be formed of the same material as the first word line capping layer 311 but is not limited thereto.

With reference to FIG. 1, in the embodiment depicted, the plurality of stress regions 401 may be respectively correspondingly disposed attached to lower portions of sidewalls of the plurality of word lines. Specifically, the plurality of stress regions 401 may be respectively correspondingly disposed attached to lower portions of sidewalls of the first word line insulating layer 307 and lower portions of sidewalls of the second word line insulating layer 319. Bottoms of the plurality of stress regions 401 may be at a vertical level lower than a vertical level of the bottom of the first word line trench 305 or a vertical level of the bottom of the second word line trench 317. Specifically, the vertical level of the bottoms of the plurality of stress regions 401 may be lower than the vertical level of the bottom of the first word line trench 305 or the vertical level of the bottom of the second word line trench 317 about 0.5 nm to 500 nm. The plurality of stress regions 401 may have a second lattice constant which may be different from the first lattice constant of the substrate 101.

The plurality of stress regions 401 may be formed of, for example, silicon germanium or silicon carbide. In addition, in some embodiments depicted, the plurality of stress regions 401 may be doped with a dopant. A dopant concentration of each of the plurality of stress regions 401 may gradually increase from an outer margin toward the first word line insulating layer 307 or the second word line insulating layer 319. Alternatively, in another embodiment depicted, the dopant concentration of each of the plurality of stress regions 401 may gradually decrease from an outer margin toward the first word line insulating layer 307 or the second word line insulating layer 319. The plurality of stress regions 401 doped with the dopant may have lower sheet resistance.

With reference to FIG. 1, in the embodiment depicted, the bit line 501 may be disposed in the substrate 101. The bit line 501 may be electrically connected to the doped region 201. Specifically, the bit line 501 may be electrically connected to the first doped region 203. The bit line 501 may include a bit line opening 503, a bit line contact 505, a bit line bottom electrode 507, a bit line top electrode 509, a bit line mask 511, and a plurality of bit line spacers 513.

With reference to FIG. 1, in the embodiment depicted, the bit line opening 503 may be disposed in the upper portion the substrate 101. Specifically, the bit line opening 503 may be disposed in an upper portion of the first doped region 203. The bit line contact 505 may be disposed in the bit line opening 503. Sidewalls of the bit line contact 505 may be distanced from sidewalls of the bit line opening 503. The bit line contact 505 may be formed of a conductive material such as doped polysilicon, a metal, a metal nitride, or a metal silicide. The metal may be, for example, aluminum, copper, tungsten, cobalt, or alloy thereof. The metal silicide may be, for example, nickel silicide, platinum silicide, titanium silicide, molybdenum silicide, cobalt silicide, tantalum silicide, tungsten silicide, or the like. A top surface of the bit line contact 505 may be at a vertical level as the same as the vertical level of the top surface of the substrate 101. The bit line contact 505 may be electrically connected to the doped region 201. Specifically, the bit line contact 505 may be electrically connected to the first doped region 203.

With reference to FIG. 1, in the embodiment depicted, the bit line bottom electrode 507 may be disposed on the bit line contact 505. The bit line bottom electrode 507 may be formed of, for example, doped polysilicon. The bit line bottom electrode 507 may be electrically connected to the bit line contact 505. The bit line top electrode 509 may be disposed on the bit line bottom electrode 507. The bit line top electrode 509 may be formed of a conductive material such as tungsten, aluminum, copper, nickel, or cobalt. The bit line top electrode 509 may be electrically connected to the bit line bottom electrode 507.

With reference to FIG. 1, in the embodiment depicted, the bit line mask 511 may be disposed on the bit line top electrode 509. The bit line mask 511 may be formed of, for example, silicon oxide, silicon nitride, silicon oxynitride, or silicon nitride oxide. The plurality of bit line spacers 513 may respectively cover sidewalls of the bit line mask 511, sidewalls of the bit line top electrode 509, sidewalls of the bit line bottom electrode 507, and the sidewalls of the bit line contact 505. The plurality of bit line spacers 513 may fill the bit line opening 503. The plurality of bit line spacers 513 may be formed of, for example, silicon oxide, silicon nitride, silicon oxynitride, or silicon nitride oxide.

With reference to FIG. 1, in the embodiment depicted, the first insulating film 107 may be disposed on the substrate 101 and may cover the bit line 501. The first insulating film 107 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto.

With reference to FIG. 1, in the embodiment depicted, the plurality of conductive plugs 111 may be disposed in the first insulating film 107. The plurality of conductive plugs 111 may be separated from each other. Specifically, the plurality of conductive plugs 111 may be respectively disposed on the second doped region 205 and the third doped region 207. The plurality of conductive plugs 111 may be respectively electrically connected to the second doped region 205 and the third doped region 207. The plurality of conductive plugs 111 may be formed of, for example, doped polysilicon, titanium, titanium nitride, tantalum, tantalum nitride, tungsten, copper, aluminum or aluminum alloy.

With reference to FIG. 1, in the embodiment depicted, the second insulating film 109 may be disposed on the first insulating film 107. The second insulating film 109 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof but is not limited thereto. A thickness of the second insulating film 109 may be about 1000 angstroms to about 100000 angstroms.

With reference to FIG. 1, in the embodiment depicted, the plurality of capacitor structures 601 may be disposed in the second insulating film 109. The plurality of capacitor structures 601 may include a plurality of capacitor openings 603, a plurality of capacitor bottom electrodes 605, a capacitor insulating layer 607, and a capacitor top electrode 609. The plurality of capacitor openings 603 may be disposed in the second insulating film 109 and may be separated from each other.

With reference to FIG. 1, in the embodiment depicted, the plurality of capacitor bottom electrodes 605 may respectively correspondingly cover inner surfaces of the plurality of capacitor openings 603. The plurality of capacitor bottom electrodes 605 may be formed of, for example, doped polysilicon, a metal, or a metal silicide. The metal may be, for example, aluminum, copper, or tungsten. The metal silicide may be, for example, nickel silicide, platinum silicide, titanium silicide, molybdenum silicide, cobalt silicide, tantalum silicide, tungsten silicide, or the like. The plurality of capacitor bottom electrodes 605 may be respectively correspondingly electrically connected to the plurality of conductive plugs 111.

With reference to FIG. 1, in the embodiment depicted, the capacitor insulating layer 607 may be disposed on the plurality of capacitor bottom electrodes 605 in the plurality of capacitor openings 603. The capacitor insulating layer 607 may be formed of a single layer including an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. A thickness of the capacitor insulating layer 607 may be about 1 angstrom to about 100 angstroms. Alternatively, in another embodiment depicted, the capacitor insulating layer 607 may be formed of a stacked layer consisting of silicon oxide, silicon nitride, and silicon oxide.

With reference to FIG. 1, in the embodiment depicted, the capacitor top electrode 609 may be disposed on the capacitor insulating layer 607. The capacitor top electrode 609 may fill the plurality of capacitor openings 603 and cover top surfaces of the capacitor insulating layer 607. The capacitor top electrode 609 may be formed of, for example, doped polysilicon, or a metal. The metal may be, for example, aluminum, copper, or tungsten.

FIGS. 2 to 6 illustrate, in schematic cross-sectional view diagrams, some semiconductor devices in accordance with some embodiment of the present disclosure.

Figure 2:
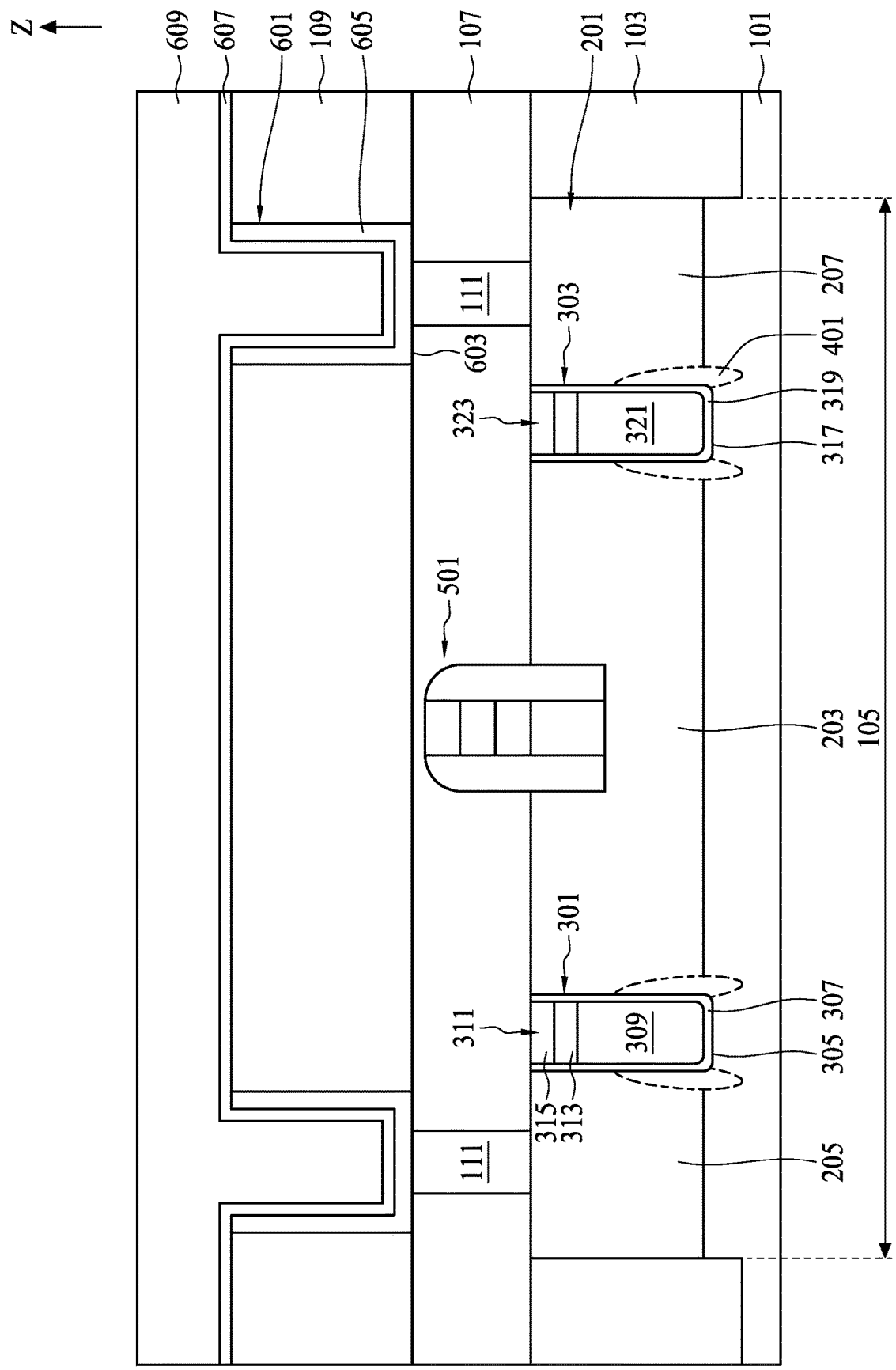
FIGS. 2 to 6 illustrate, in schematic cross-sectional view diagrams, some semiconductor devices in accordance with some embodiment of the present disclosure.

With reference to FIG. 2, in another embodiment depicted, the first word line capping layer 311 may be formed of a stacked layer including a bottom capping layer 313 and a top capping layer 315. The bottom capping layer 313 may be disposed on the first word line electrode 309. The top capping layer 315 may be disposed on the bottom capping layer 313. The bottom capping layer 313 may be formed of an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. The top capping layer 315 may be formed of a low dielectric-constant material such as silicon oxide, silicon nitride, silicon oxynitride, silicon nitride oxide, fluoride-doped silicate, or the like. The top capping layer 315 formed of the low dielectric-constant material may reduce electric field at the top surface of the substrate 101; therefore, such that leakage current may be reduce.

Figure 3:
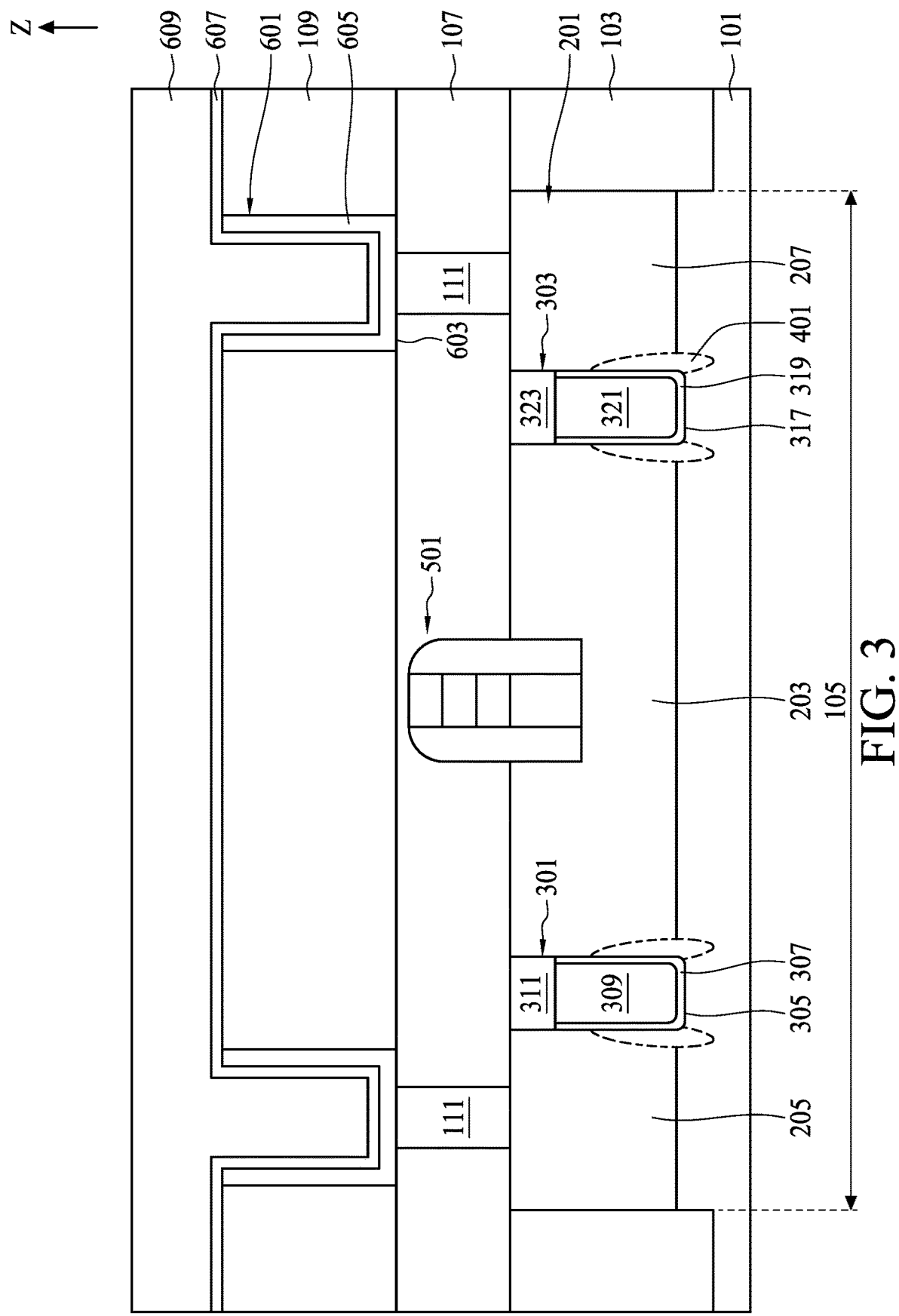

With reference to FIG. 3, in another embodiment depicted, the first word line insulating layer 307 may only cover a lower portion of the inner surface of the first word line trench 305. The sidewalls of the first word line capping layer 311 may directly contact an upper portion of the inner surface of the first word line trench 305. The first word line capping layer 311 may be disposed above the first word line insulating layer 307.

Figure 4:
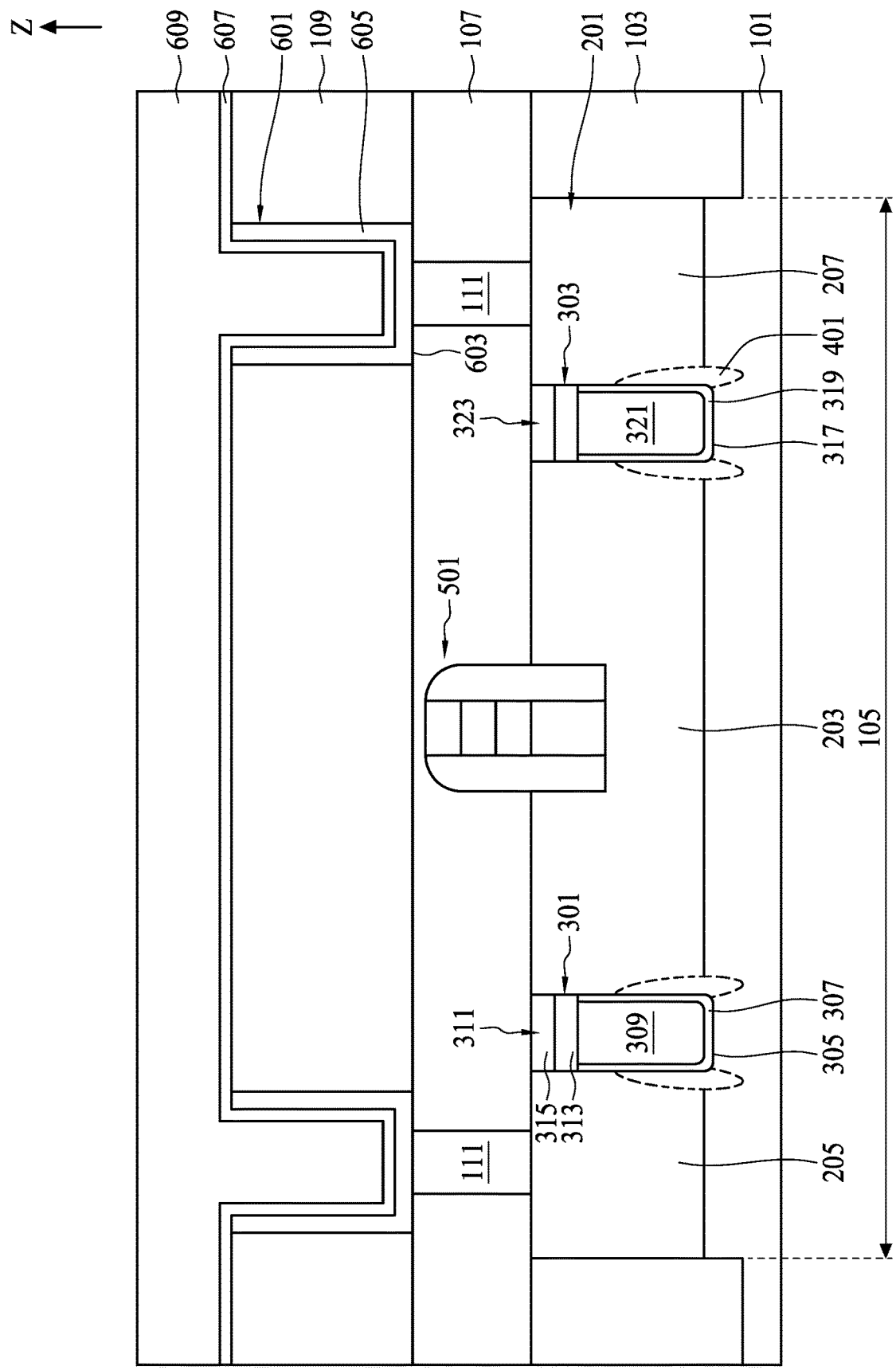

With reference to FIG. 4, in another embodiment depicted, the first word line insulating layer 307 may only cover the lower portion of the inner surface of the first word line trench 305. The sidewalls of the first word line capping layer 311 may directly contact the upper portion of the inner surface of the first word line trench 305. The first word line capping layer 311 may be formed of a stacked layer including a bottom capping layer 313 and a top capping layer 315. The bottom capping layer 313 may be disposed on the first word line electrode 309. The top capping layer 315 may be disposed on the bottom capping layer 313. Specifically, the bottom capping layer 313 may directly contact the upper portion of the inner surface of the first word line trench 305. The top capping layer 315 may directly contact the upper portion of the inner surface of the first word line trench 305. The bottom capping layer 313 may be formed of an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. The top capping layer 315 may be formed of a low dielectric-constant material such as silicon oxide, silicon nitride, silicon oxynitride, silicon nitride oxide, fluoride-doped silicate, or the like. The top capping layer 315 formed of the low dielectric-constant material may reduce electric field at the top surface of the substrate 101; therefore, such that leakage current may be reduce.

Figure 5:
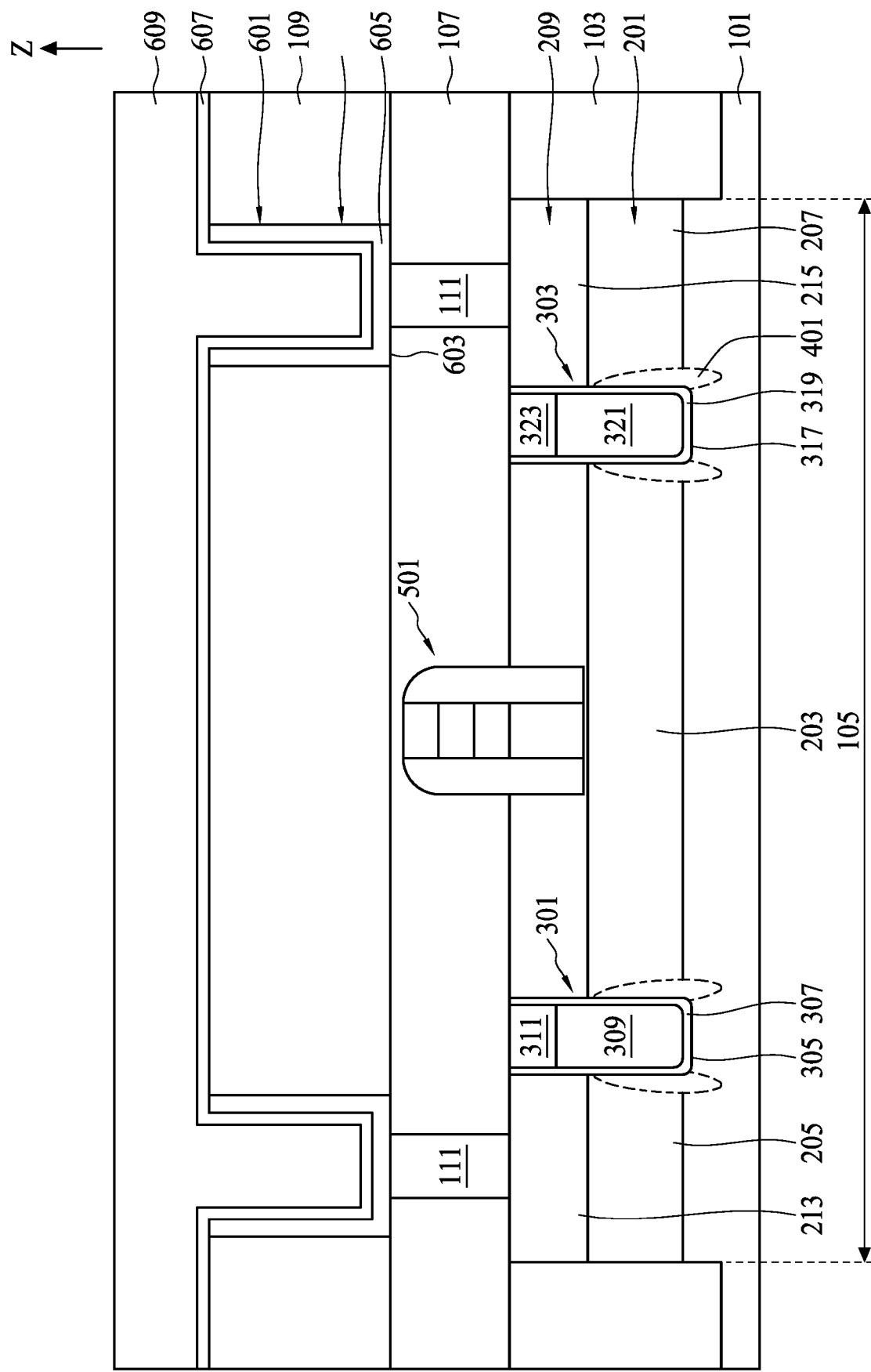

With reference to FIG. 5, in another embodiment depicted, the semiconductor device may further include a heavily doped region 209. The heavily doped region 209 may be disposed in the upper portion of the substrate 101. Specifically, the heavily doped region 209 may be disposed in the upper portion of the doped region 201. The heavily doped region 209 may have a dopant concentration greater than the dopant concentration of the doped region 201. The heavily doped region 209 may include a first heavily doped region 211, a second heavily doped region 213, and a third doped region 207. The first heavily doped region 211 may be disposed between the first word line 301 and the second word line 303. The bit line contact 505 may be electrically connected to the first heavily doped region 211. The second heavily doped region 213 may be disposed between the isolation layer 103 and the first word line 301. The second heavily doped region 213 may be opposite to the first heavily doped region 211 with the first word line 301 interposed therebetween. The third heavily doped region 215 may be disposed between the second word line 303 and the isolation layer 103. The third heavily doped region 215 may be opposite to the first heavily doped region 211 with the second word line 303 interposed therebetween. The first heavily doped region 211, the second heavily doped region 213, and the third heavily doped region 215 may exert as ohmic contacts.

Figure 6:
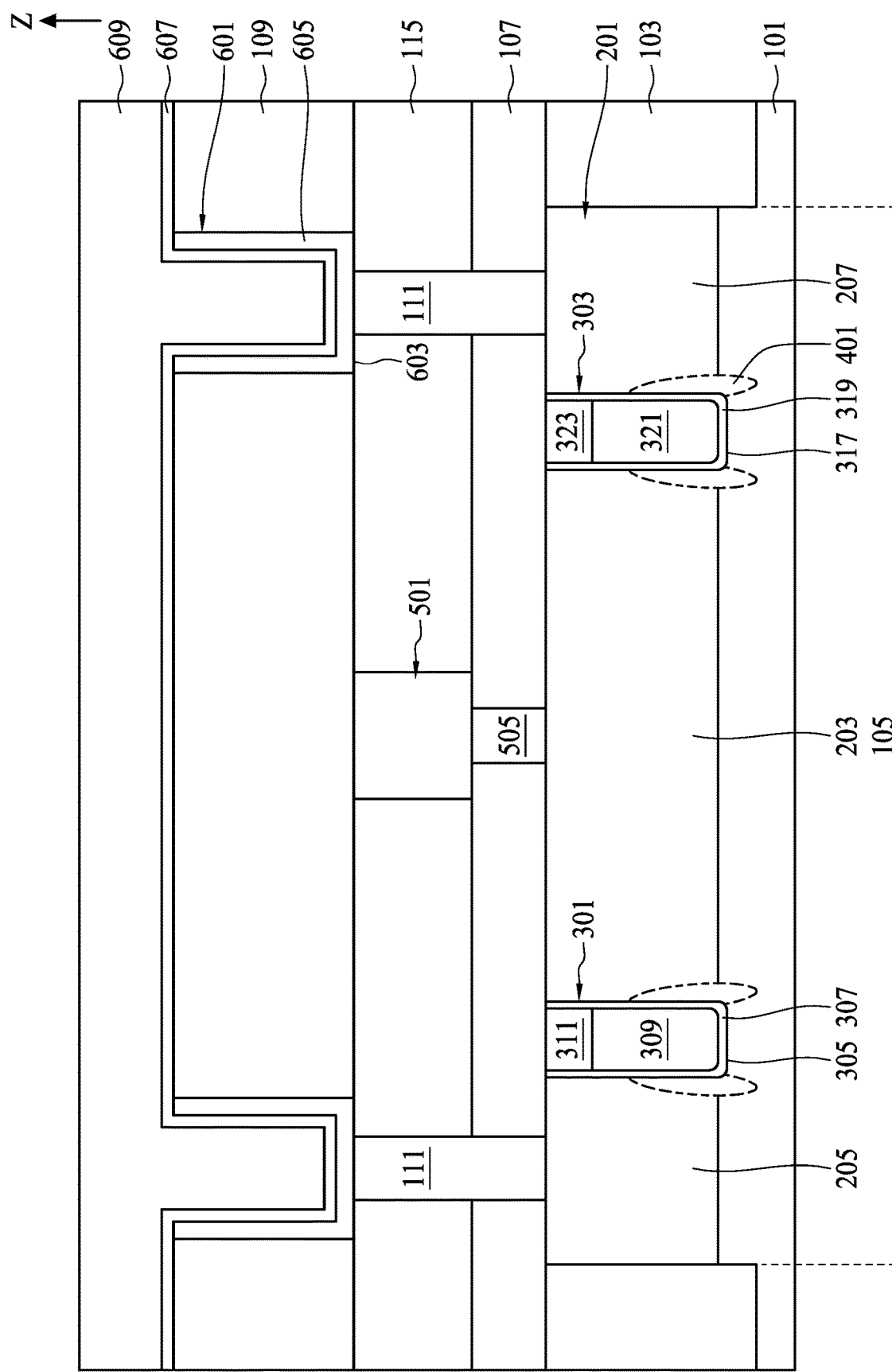

With reference to FIG. 6, in another embodiment depicted, the semiconductor device may further include a third insulating film 115. The third insulating film 115 may be disposed between the first insulating film 107 and the second insulating film 109. The third insulating film 115 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. The plurality of conductive plugs 111 may be respectively correspondingly disposed passed through the first insulating film 107 and the third insulating film 115. The bit line contact 505 may be disposed in the first insulating film 107 and electrically connected to the first doped region 203. The bit line 501 may be disposed on the bit line contact 505 and in the third insulating film 115.

Figure 7:
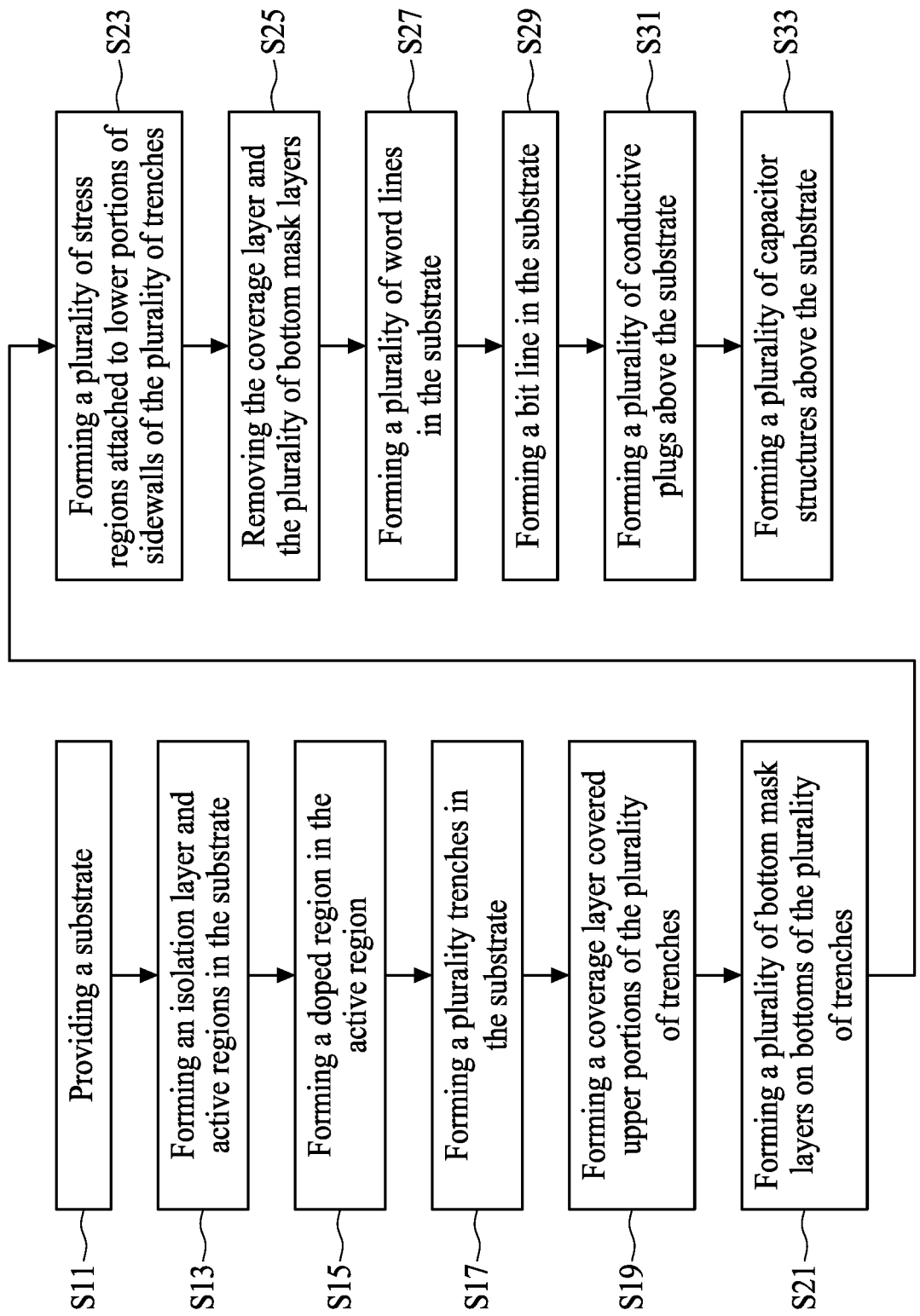
FIG. 7 illustrates, in a flowchart diagram form, a method for fabricating a semiconductor device in accordance with one embodiment of the present disclosure.

FIG. 7 illustrates, in a flowchart diagram form, a method 10 for fabricating a semiconductor device in accordance with one embodiment of the present disclosure. FIGS. 8 to 14 illustrate, in schematic cross-sectional diagrams, part of a flow of fabricating a semiconductor device in accordance with one embodiment of the present disclosure. FIG. 15 illustrates, in a schematic cross-sectional diagram, part of a flow of fabricating a semiconductor device in accordance with another embodiment of the present disclosure. FIGS. 16 to 33 illustrate, in schematic cross-sectional diagrams, part of the flow of fabricating a semiconductor device in accordance with one embodiment of the present disclosure.

Figure 8:
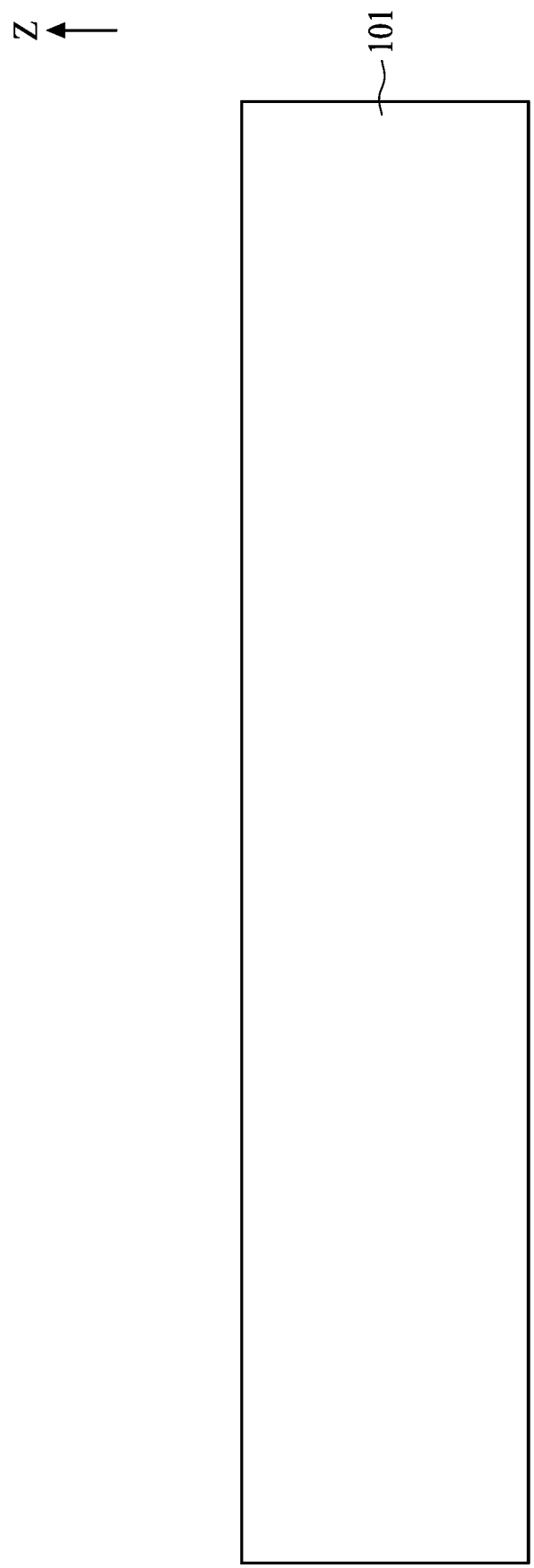
FIGS. 8 to 14 illustrate, in schematic cross-sectional diagrams, part of a flow of fabricating a semiconductor device in accordance with one embodiment of the present disclosure.

With reference to FIGS. 7 and 8, at step S11, in the embodiment depicted, a substrate 101 may be provided. The substrate 101 may be formed of, for example, silicon, germanium, silicon germanium, silicon carbon, silicon germanium carbon, gallium, gallium arsenic, indium arsenic, indium phosphorus and all other IV-IV, III-V or II-VI semiconductor materials. The substrate 101 may have a first lattice constant and a crystal orientation <100>. Alternatively, in another embodiment depicted, the substrate 101 may include an organic semiconductor or a layered semiconductor such as silicon/silicon germanium, a silicon-on-insulator or a silicon germanium-on-insulator. When the substrate 101 may be formed of silicon-on-insulator, the substrate 101 may include a top semiconductor layer and a bottom semiconductor layer formed of silicon, and a buried insulating layer which may separate the top semiconductor layer and the bottom semiconductor layer. The buried insulating layer may include, for example, a crystalline or non-crystalline oxide, nitride or any combination thereof.

Figure 9:
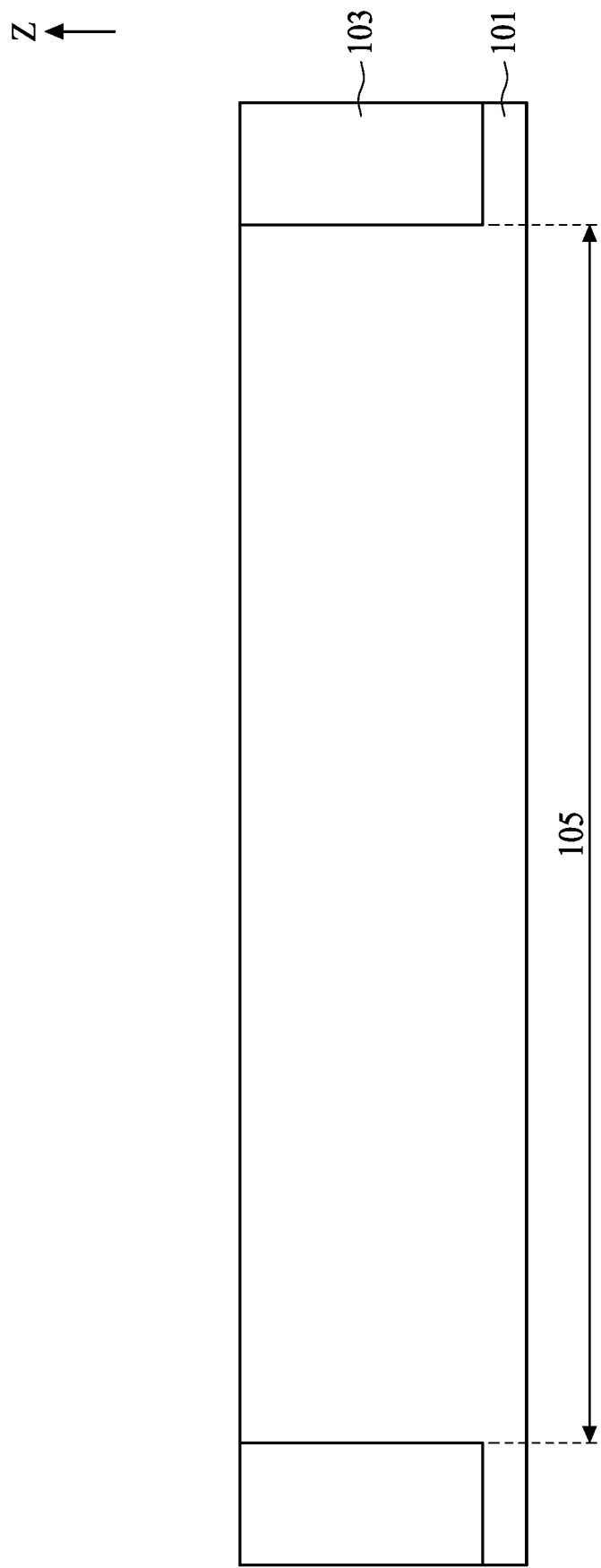

With reference to FIGS. 7 and 9, at step S13, in the embodiment depicted, an isolation layer 103 may be formed in the substrate 101. The isolation layer 103 may define an active region 105 of the substrate 101. The isolation layer 103 may be formed of an insulating material such as silicon oxide, silicon nitride, silicon oxynitride, silicon nitride oxide, or fluoride-doped silicate. A photolithography process may be performed to pattern the substrate 101 to define a position of the active region 105. An etch process may be performed after the photolithography process to form a trench in the substrate 101. After the etch process, the insulating material may be used to fill the trench by a deposition process. A planarization process, such as chemical mechanical polishing, may be performed after the deposition process to remove excess filling material and provide a substantially flat surface for subsequent processing steps and conformally form the isolation layer 103 and the active regions 105. Although the embodiment only depicts one active region 105, the semiconductor device may include any number of active regions 105.

Figure 10:
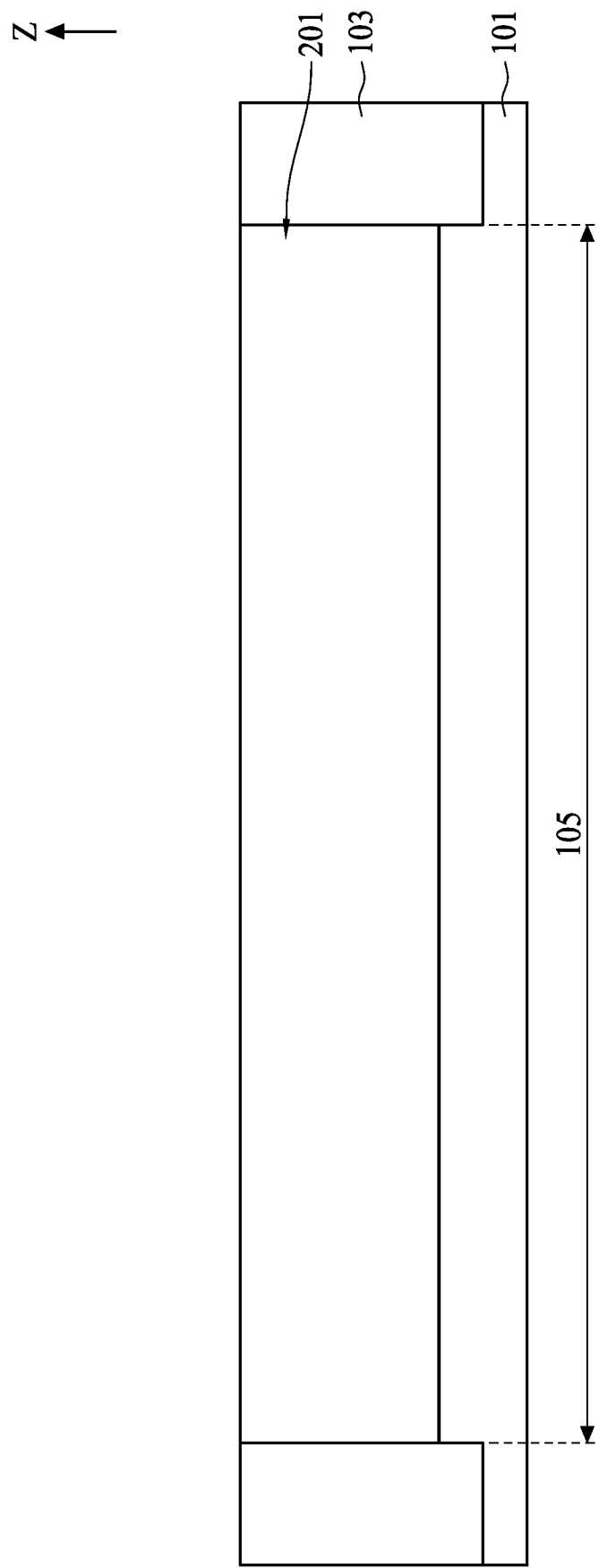

With reference to FIGS. 7 and 10, at step S15, in the embodiment depicted, a doped region 201 may be formed in the active region 105 and may be located in an upper portion of the substrate 101. The doped region 201 may be doped by a dopant and have a dopant concentration ranging from 1E17 atoms/cm^3 to about 1E19 atoms/cm^3. The dopant may be phosphorus, arsenic, or antimony. Alternatively, in another embodiment depicted, the dopant may be boron.

Figure 11:
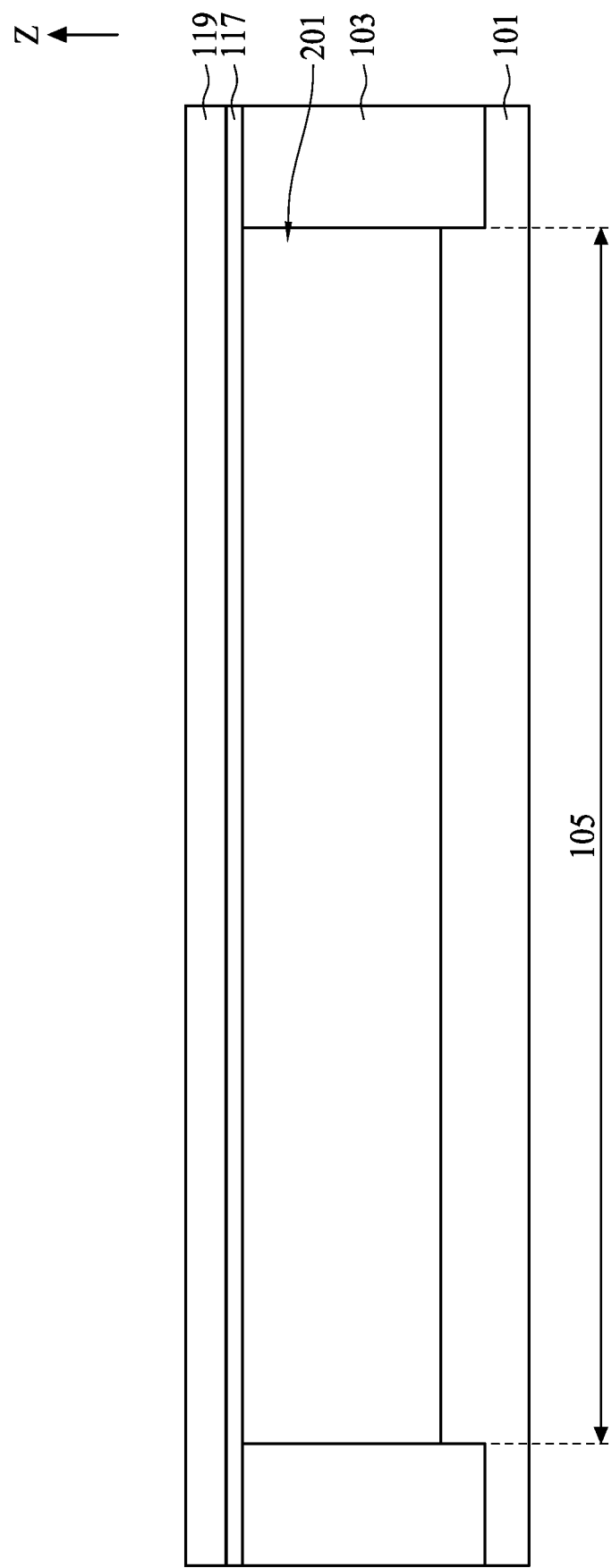
Figure 12:
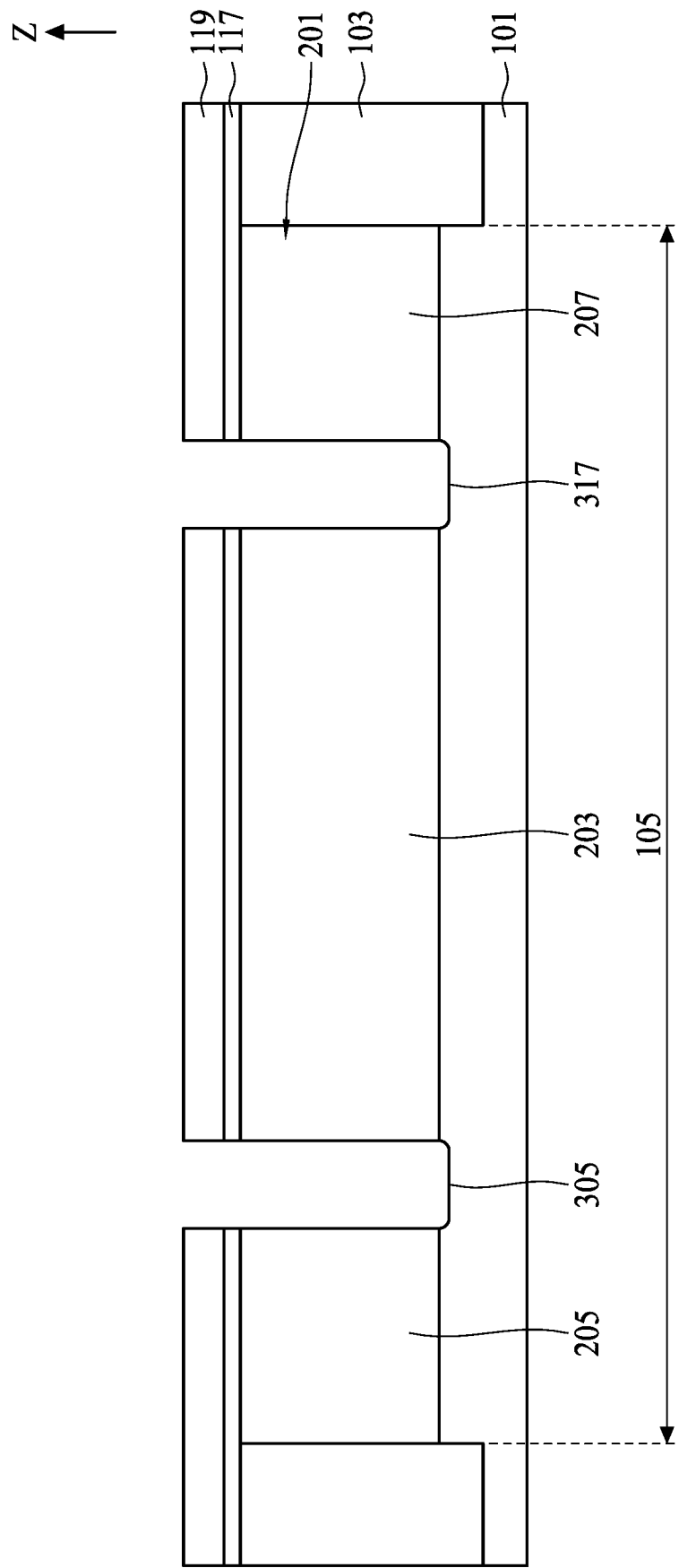

With reference to FIGS. 7, 11, and 12, at step S17, in the embodiment depicted, a plurality of trenches may be formed in the substrate 101. With reference to FIG. 11, a first mask layer 117 may be formed on the substrate 101 by a deposition process such as chemical vapor deposition. The first mask layer 117 may be formed of, for example, silicon oxide. A second mask layer 119 may be formed on the substrate 101 by another deposition process such as chemical vapor deposition. The second mask layer 119 may be formed of for example, silicon nitride.

With reference to FIG. 12, the plurality of trenches may be formed in the substrate 101. The plurality of trenches may be referred to a first word line trench 305 and a second word line trench 317. The first word line trench 305 and the second word line trench 317 may divide the doped region 201 into a first doped region 203, a second doped region 205, and a third doped region 207. The first doped region 203 may be disposed between the first word line trench 305 and the second word line trench 317. The second doped region 205 may be disposed between the isolation layer 103 and the first word line trench 305. The second doped region 205 may be opposite to the first doped region 203 with the first word line trench 305 interposed therebetween. The third doped region 207 may be disposed between the second word line trench 317 and the isolation layer 103. The third doped region 207 may be opposite to the first doped region 203 with the second word line trench 317 interposed therebetween.

With reference to FIG. 12, bottoms of the first word line trench 305 and the second word line trench 317 may be flat. The bottoms of the first word line trench 305 and the second word line trench 317 may be slightly lower than a bottom of the doped region 201. Specifically, the bottoms of the first word line trench 305 and the second word line trench 317 may be lower than the bottom of the doped region 201 about 0.1 nm to about 50 nm. A photolithography process may be performed to pattern the substrate 101 to define positions of the first word line trench 305 and the second word line trench 317. An etch process may be performed after the photolithography process to form the first word line trench 305 and the second word line trench 317 in the substrate 101.

Figure 13:
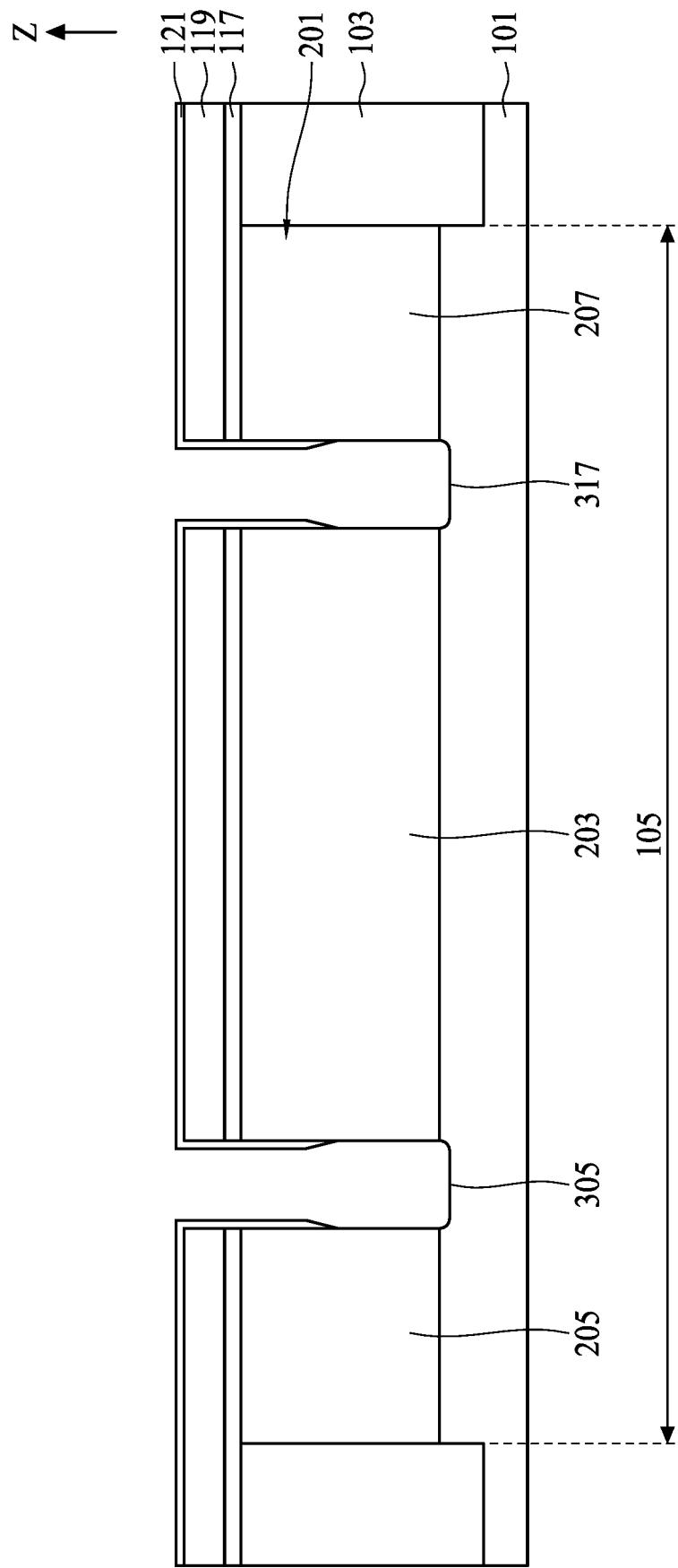

With reference to FIGS. 7 and 13, at step S19, in the embodiment depicted, a coverage layer 121 may be formed to cover upper portions of the first word line trench 305 and the second word line trench 317. The coverage layer 121 may also cover top surfaces of the second mask layer 119. The coverage layer 121 may be formed by a deposition process such as an atomic layer deposition method precisely controlling a quantity of a first precursor of the atomic layer deposition method. The coverage layer 121 may be formed of, for example, aluminum oxide, hafnium oxide, zirconium oxide, titanium oxide, titanium nitride, tungsten nitride, silicon nitride, or silicon oxide.

In the present embodiment depicted, when the coverage layer 121 may be formed of aluminum oxide, the first precursor of the atomic layer deposition method may be trimethylaluminum and a second precursor of the atomic layer deposition method may be water or ozone. Alternatively, in another embodiment depicted, when the coverage layer 121 may be formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone. Alternatively, in another embodiment depicted, when the coverage layer 121 may be formed of zirconium oxide, the first precursor of the atomic layer deposition method may be zirconium tetrachloride and the second precursor of the atomic layer deposition method may be water or ozone. Alternatively, in another embodiment depicted, when the coverage layer 121 may be formed of titanium oxide, the first precursor of the atomic layer deposition method may be titanium tetrachloride, tetraethyl titanate, or titanium isopropoxide and the second precursor of the atomic layer deposition method may be water or ozone. Alternatively, in another embodiment depicted, when the coverage layer 121 may be formed of titanium nitride, the first precursor of the atomic layer deposition method may be titanium tetrachloride and ammonia. Alternatively, in another embodiment depicted, when the coverage layer 121 may be formed of tungsten nitride, the first precursor of the atomic layer deposition method may be tungsten hexafluoride and ammonia. Alternatively, in another embodiment depicted, when the coverage layer 121 may be formed of silicon nitride, the first precursor of the atomic layer deposition method may be silylene, chlorine, ammonia, and dinitrogen tetrahydride. Alternatively, in another embodiment depicted, when the coverage layer 121 may be formed of silicon oxide, the first precursor of the atomic layer deposition method may be silicon tetraisocyanate or $CH_3OSi(NCO)_3$ and the second precursor of the atomic layer deposition method may be hydrogen or ozone.

Figure 14:
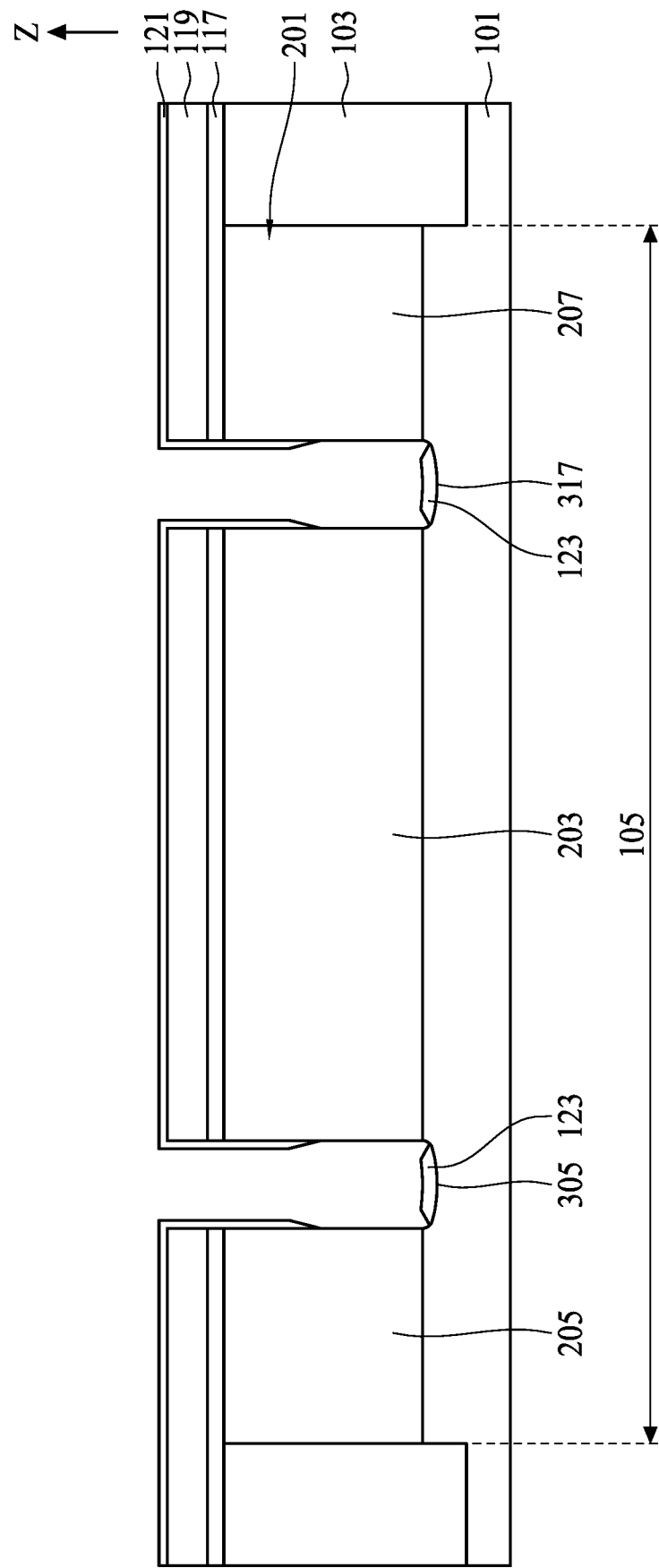
Figure 15:
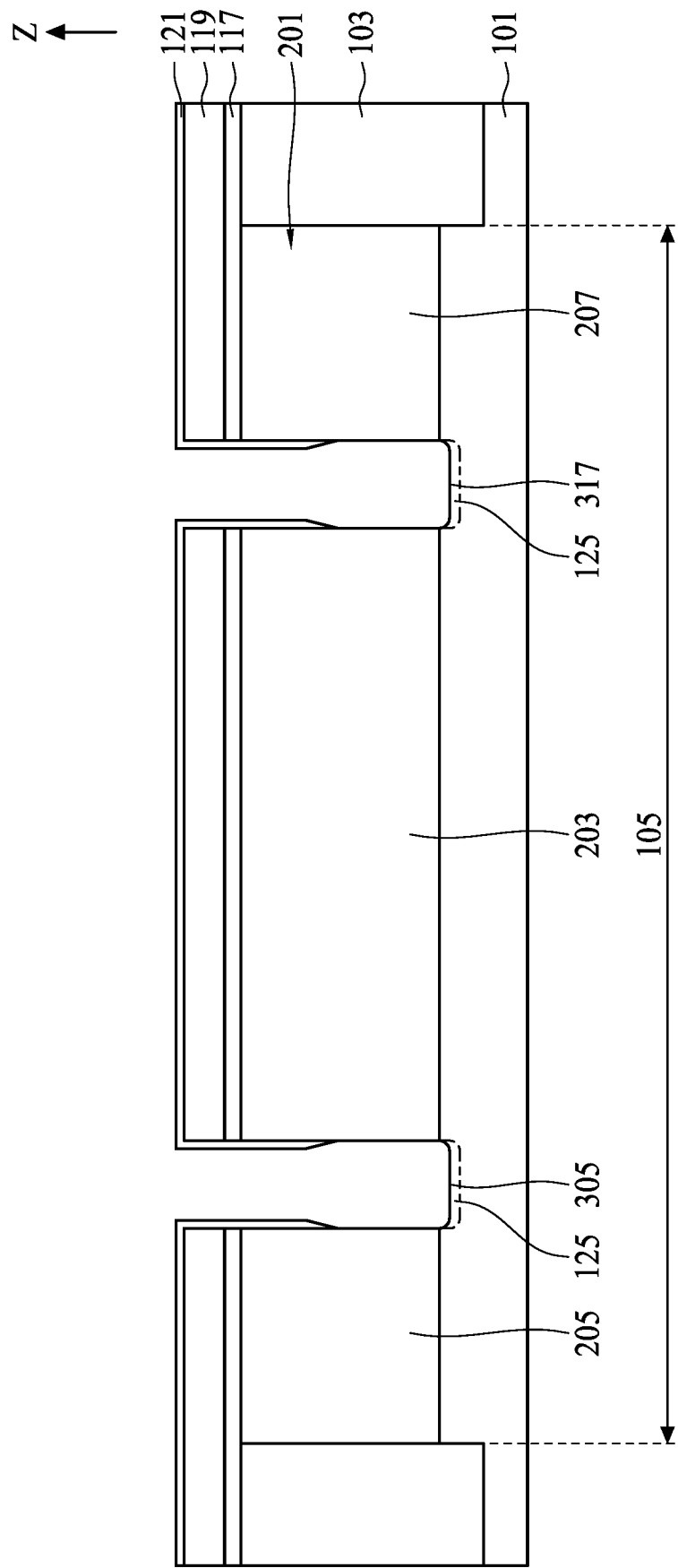
FIG. 15 illustrates, in a schematic cross-sectional diagram, part of another flow of fabricating a semiconductor device in accordance with another embodiment of the present disclosure.

With reference to FIGS. 7 and 14, at step S21, in the embodiment depicted, a plurality of bottom mask layers 123 may be respectively correspondingly formed on the bottoms of the first word line trench 305 and the second word line trench 317. The plurality of bottom mask layers 123 may be formed of, for example, silicon oxide or the like. The plurality of bottom mask layers 123 may be formed by a deposition process and a sequential etch process.

With reference to FIG. 15, in another embodiment depicted, a bottom doped region 125 may be respectively correspondingly formed below the bottoms of the first word line trench 305 and the second word line trench 317 by an implantation process. The bottom doped region 125 may have a lower etch rate compared to the doped region 201 and the substrate 101.

Figure 16:
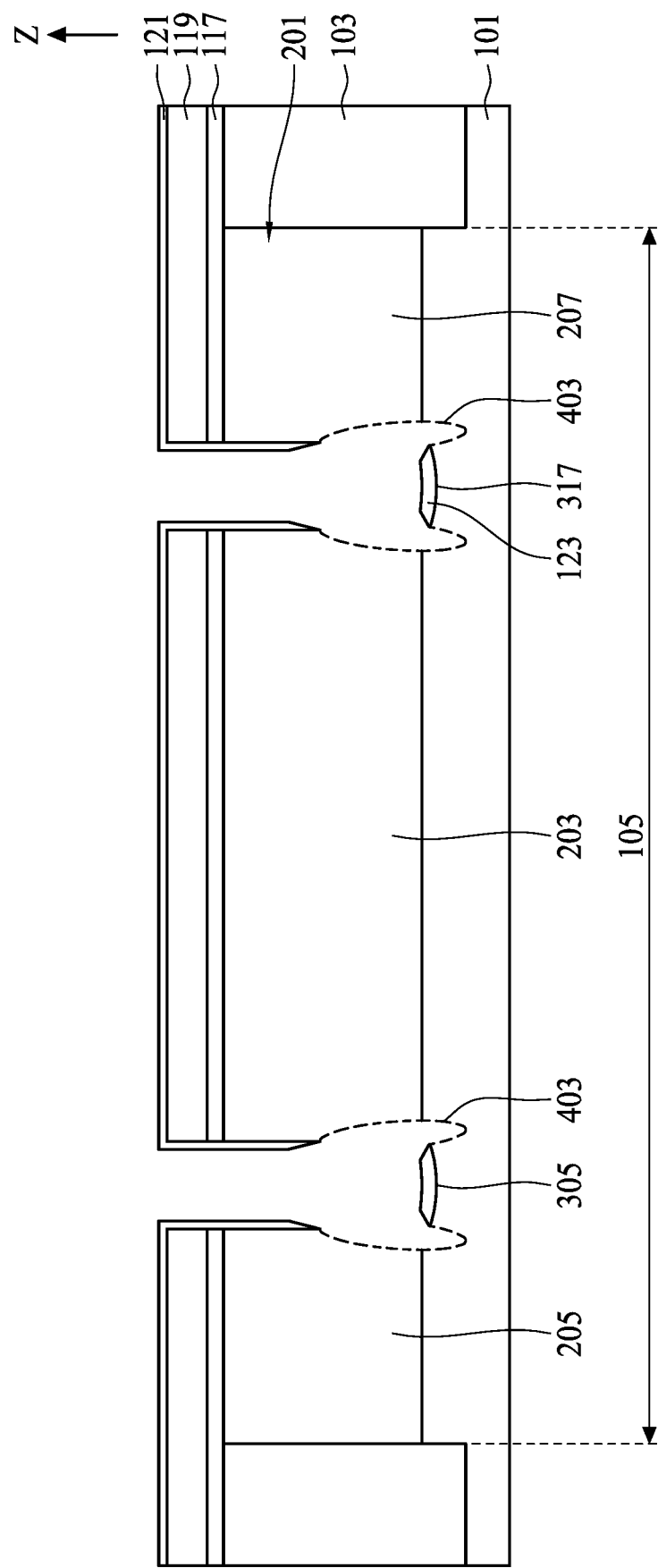
FIGS. 16 to 33 illustrate, in schematic cross-sectional diagrams, part of the flow of fabricating a semiconductor device in accordance with one embodiment of the present disclosure.
Figure 17:
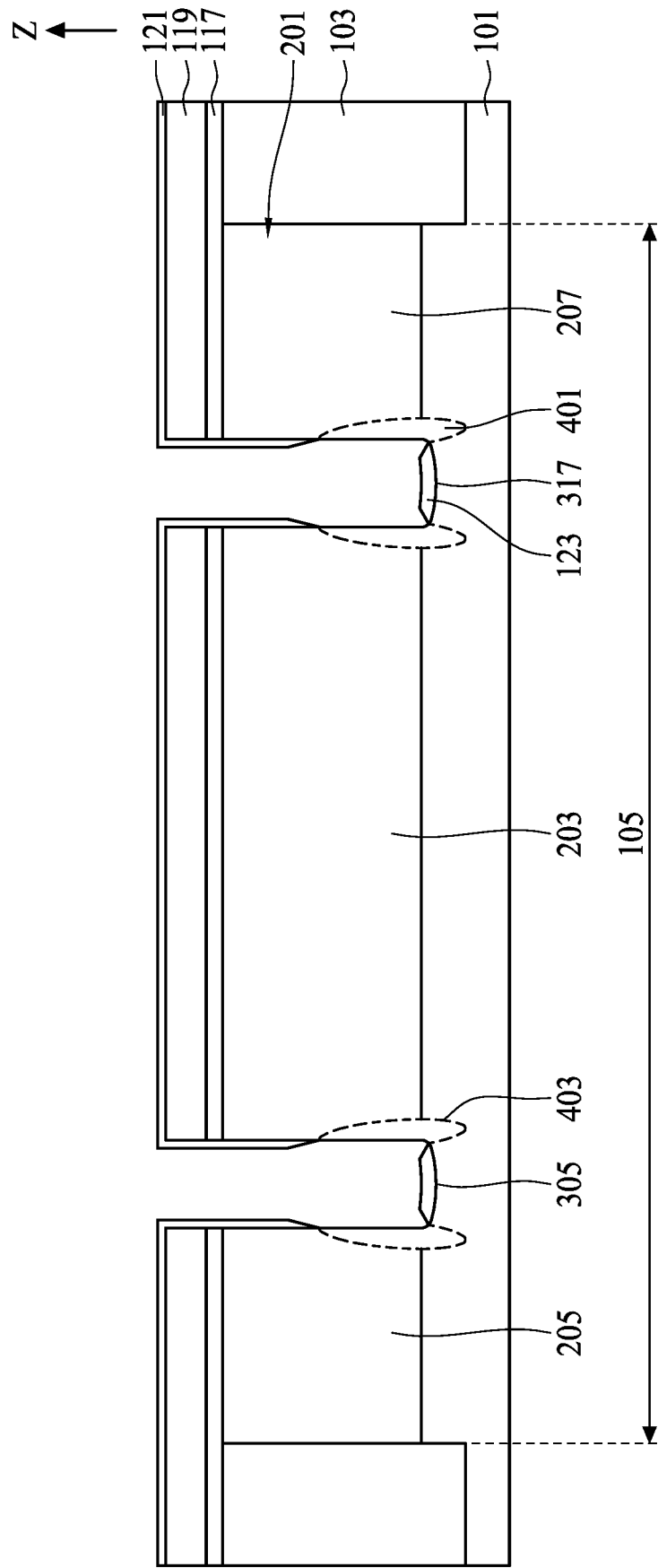

With reference to FIGS. 7, 16, and 17, at step S23, in the embodiment depicted, a plurality of stress regions 401 may be respectively correspondingly formed attached to lower portions of sidewalls of the first word line trench 305 and the second word line trench 317. With reference to FIG. 16, a plurality of side recesses 403 may be respectively correspondingly formed extended outwardly at the lower portions of inner surfaces of the first word line trench 305 and the second word line trench 317. Bottoms of the plurality of side recesses 403 may be at a vertical level lower than a vertical level of the bottom of the first word line trench 305 or a vertical level of the bottom of the second word line trench 317. Specifically, the vertical level of the bottoms of the plurality of side recesses 403 may be lower than the vertical level of the bottom of the first word line trench 305 or the vertical level of the bottom of the second word line trench 317 about 0.5 nm to 500 nm. The plurality of side recesses 403 may be formed by an etch process such as wet etch. The bottom mask layer 123 may exert a protection layer to prevent a region below the bottom mask layer 123 from etching during the etch process; in other words, the region below the bottom mask layer 123 may remain intact. In addition, the coverage layer 121 may also exert a protection layer for the upper portion of the doped region 201 during the etching process.

With reference to FIG. 17, a plurality of stress regions 401 may be formed in the plurality of side recesses 403 by a deposition process such as selective epitaxy growth. The plurality of stress regions 401 may have a second lattice constant which may be different from the first lattice constant of the substrate 101. The plurality of stress regions 401 may be formed of for example, silicon germanium or silicon carbide. In addition, in some embodiments depicted, the plurality of stress regions 401 may be doped with a dopant. A dopant concentration of each of the plurality of stress regions 401 may gradually increase from an outer margin toward the first word line insulating layer 307 or the second word line insulating layer 319. Alternatively, in another embodiment depicted, the dopant concentration of each of the plurality of stress regions 401 may gradually decrease from an outer margin toward the first word line insulating layer 307 or the second word line insulating layer 319. The plurality of stress regions 401 doped with the dopant may have lower sheet resistance.

Figure 18:
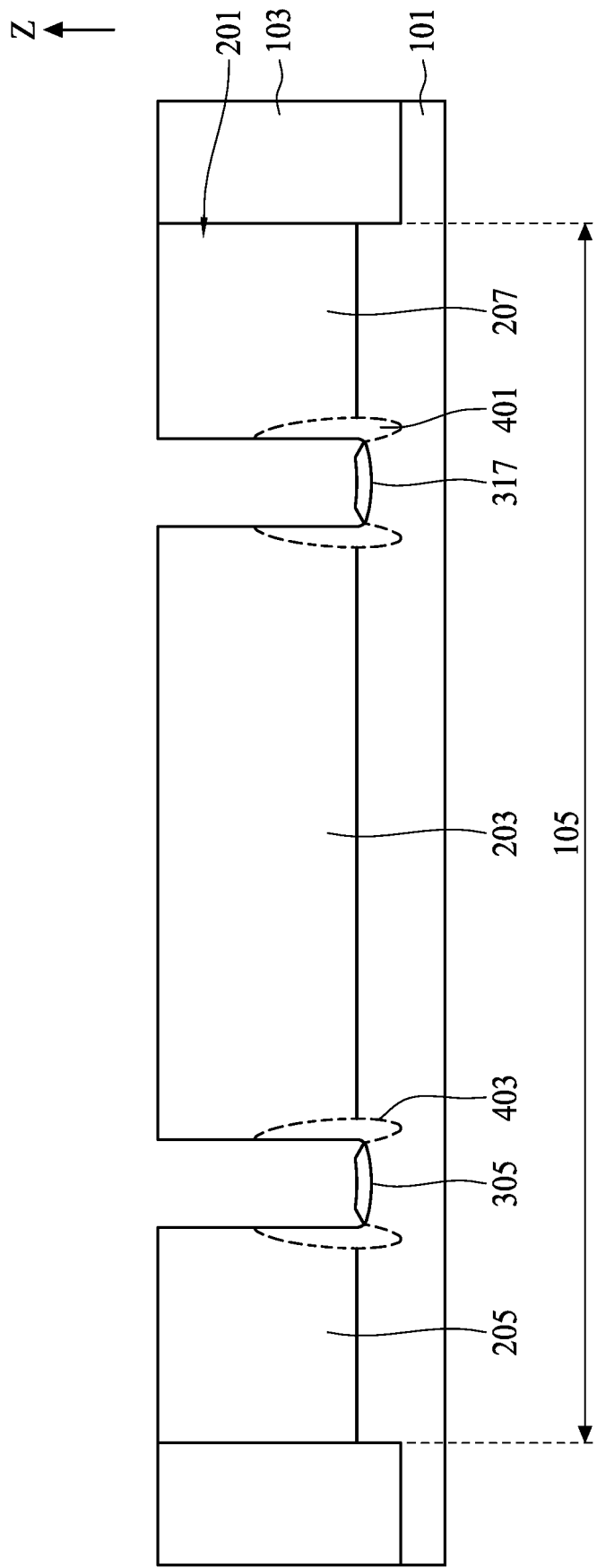
Figure 19:
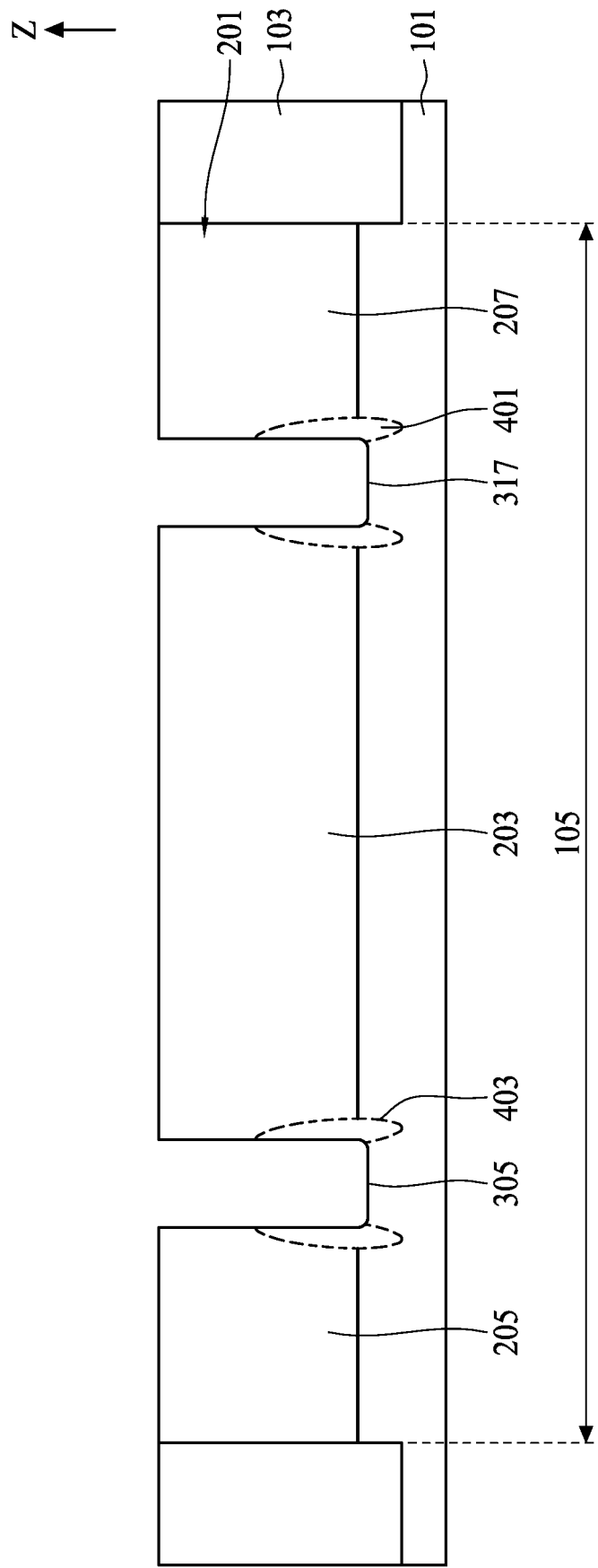

With reference to FIGS. 7, 18, and 19, at step S25, in the embodiment depicted, the coverage layer 121, the second mask layer 119, the first mask layer 117, and the plurality of bottom mask layers 123 may be removed by sequential etch processes such as wet etch or dry etch.

Figure 20:
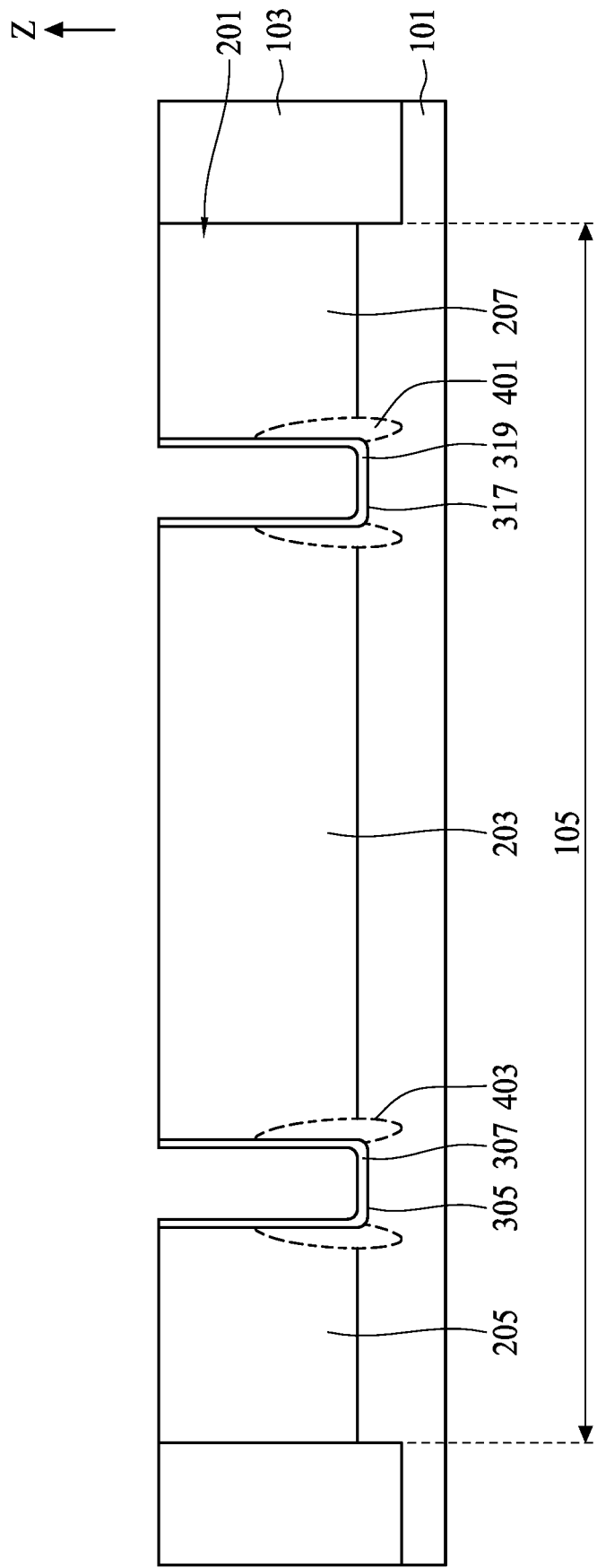

With reference to FIGS. 7 and 20 to 22, at step S27, in the embodiment depicted, a plurality of word lines may be formed in the active region 105 of the substrate 101. With reference to FIG. 20, a first word line insulating layer 307 and a second word line insulating layer 319 may be formed to respectively correspondingly cover inner surfaces of the first word line trench 305 and the second word line trench 317. The plurality of stress regions 401 may be respectively correspondingly disposed attached to lower portions of sidewalls of the first word line insulating layer 307 and lower portions of sidewalls of the second word line insulating layer 319. The first word line insulating layer 307 and the second word line insulating layer 319 may be formed of an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. Thicknesses of the first word line insulating layer 307 and the second word line insulating layer 319 may be about 0.5 nm to about 10 nm. Alternatively, in another embodiment depicted, the insulating material may be silicon oxide, silicon nitride, silicon oxynitride, silicon nitride oxide, or the like. The second word line insulating layer 319 may be formed of the same material as the first word line insulating layer 307 but is not limited thereto.

Figure 21:
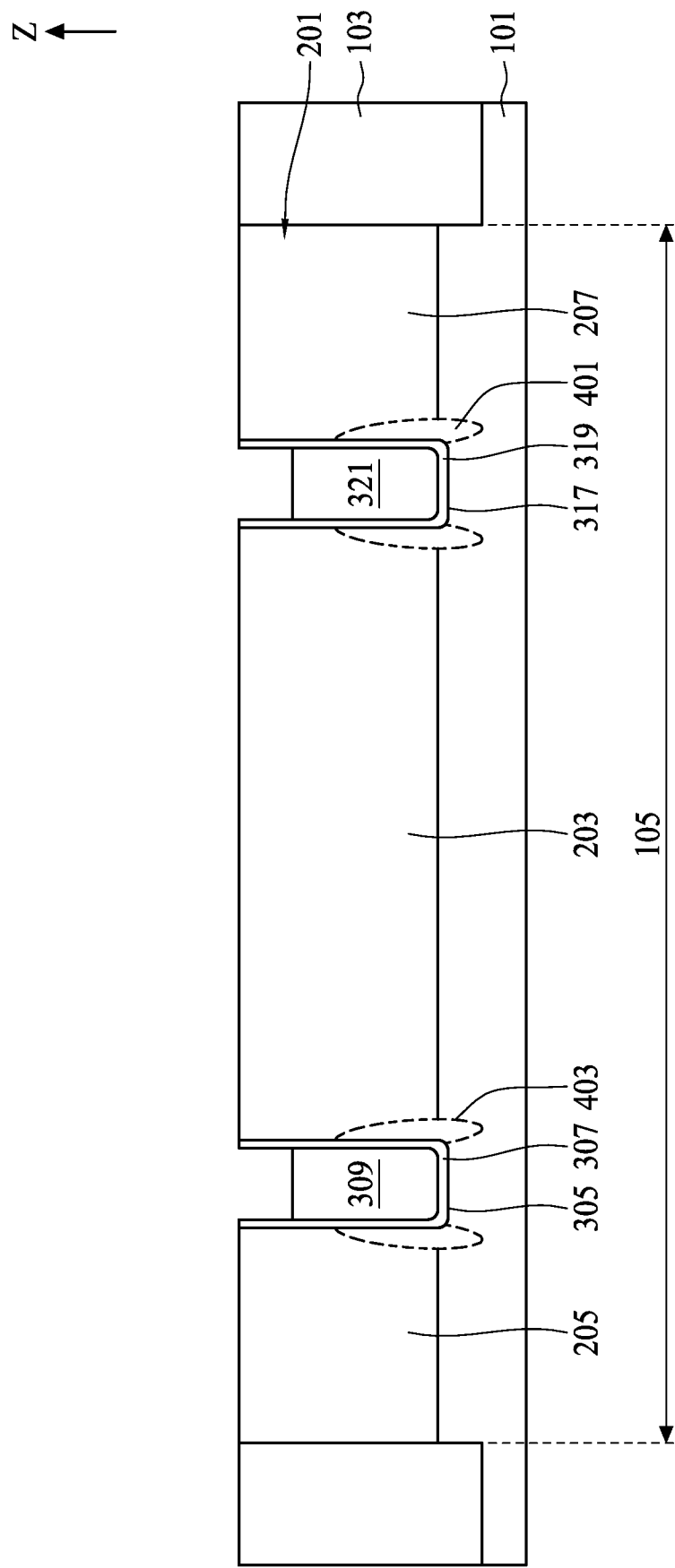

With reference to FIG. 21, a first word line electrode 309 and a second word line electrode 321 may be respectively correspondingly formed on the first word line insulating layer 307 in the first word line trench 305 and the second word line insulating layer 319 in the second word line trench 317. The first word line electrode 309 and the second word line electrode 321 may be formed of a conductive material such as doped polysilicon, silicon germanium, a metal, a metal alloy, a metal silicide, a metal nitride, a metal carbide, or combinations including multilayers thereof. The metal may be, for example, aluminum, copper, tungsten, or cobalt. The metal silicide may be, for example, nickel silicide, platinum silicide, titanium silicide, molybdenum silicide, cobalt silicide, tantalum silicide, tungsten silicide, or the like. Thicknesses of the first word line electrode 309 and the second word line electrode 321 may be about 50 nm to about 500 nm. The second word line electrode 321 may be formed of the same material of the first word line electrode 309 but is not limited thereto.

Figure 22:
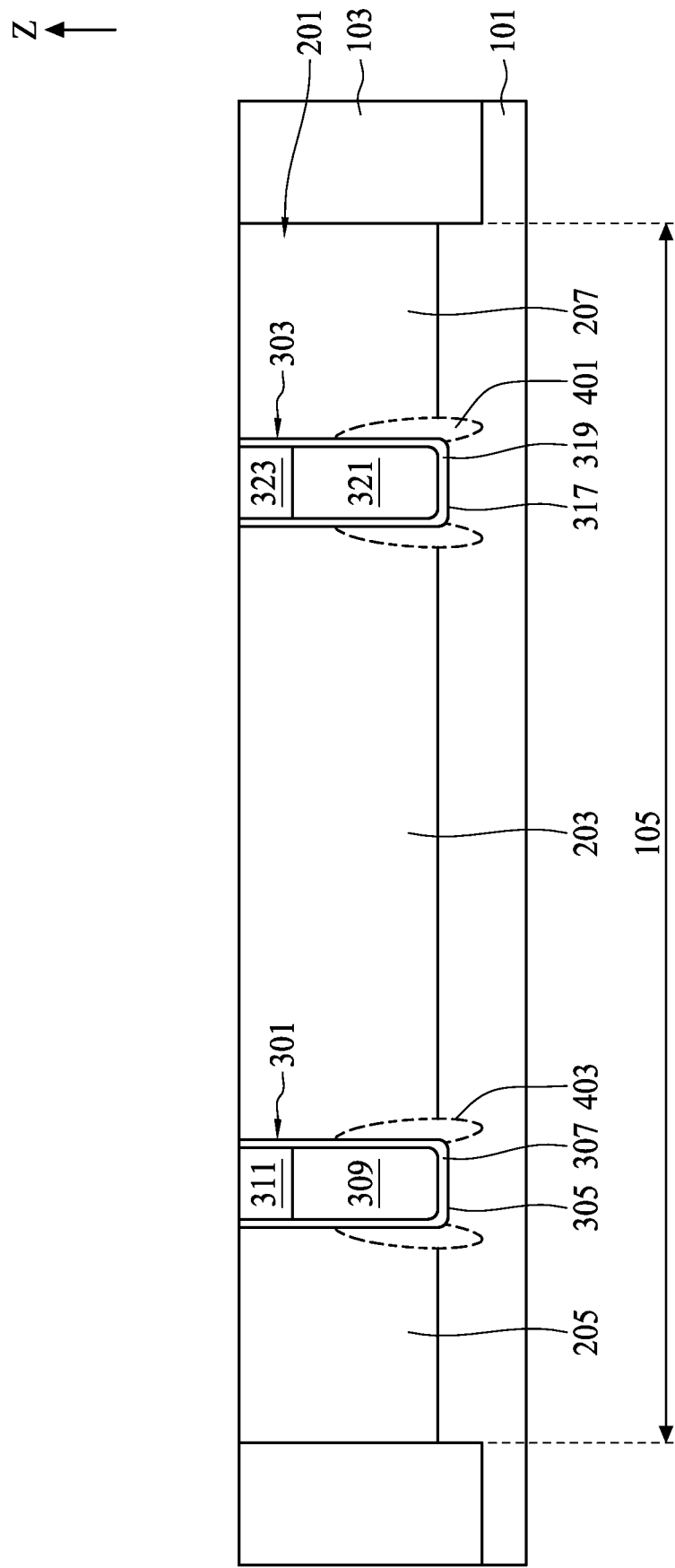

With reference to FIG. 22, a first word line capping layer 311 and a second word line capping layer 323 may be respectively correspondingly formed on the first word line electrode 309 in the first word line trench 305 and the second word line electrode 321 in the second word line trench 317. Top surfaces of the first word line capping layer 311 and the second word line capping layer 323 may be at a vertical level as the same as the vertical level of the top surface of the substrate 101. Sidewalls of the first word line capping layer 311 and the second word line capping layer 323 may be directly respectively correspondingly contact upper portions of inner surfaces of the first word line insulating layer 307 and the second word line insulating layer 319. The first word line capping layer 311 and the second word line capping layer 323 may be formed of a single layer including an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. Alternatively, in another embodiment depicted, the insulating material may be silicon oxide, silicon nitride, silicon oxynitride, silicon nitride oxide, or the like. The second word line capping layer 323 may be formed of the same material as the first word line capping layer 311 but is not limited thereto.

With reference to FIG. 22, the first word line trench 305, the first word line insulating layer 307, the first word line electrode 309, and the first word line capping layer 311 together form a first word line 301. The second word line trench 317, the second word line insulating layer 319, the second word line electrode 321, and the second word line capping layer 323 together form a second word line 303.

Figure 23:
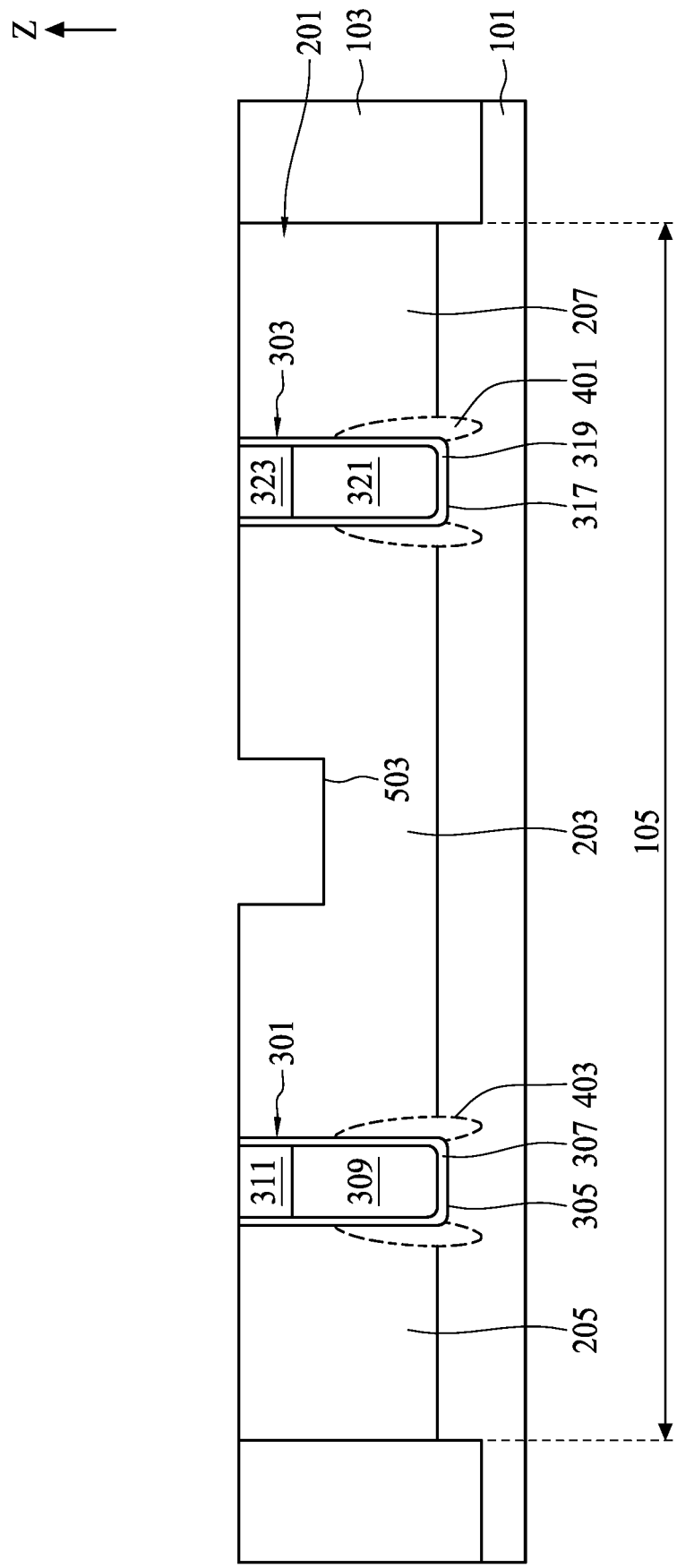

With reference to FIGS. 7 and 23 to 28, at step S29, in the embodiment depicted, a bit line 501 may be formed in the substrate 101. With reference to FIG. 23, a bit line opening 503 may be formed passed the upper portion of the substrate 101. A photolithography process may be performed to pattern the substrate 101 to define a position of the bit line opening 503. An etch process may be performed after the photolithography process to form the bit line opening 503 passed the upper portion of the substrate 101. Specifically, the bit line opening 503 may be formed in an upper portion of the first doped region 203.

Figure 24:
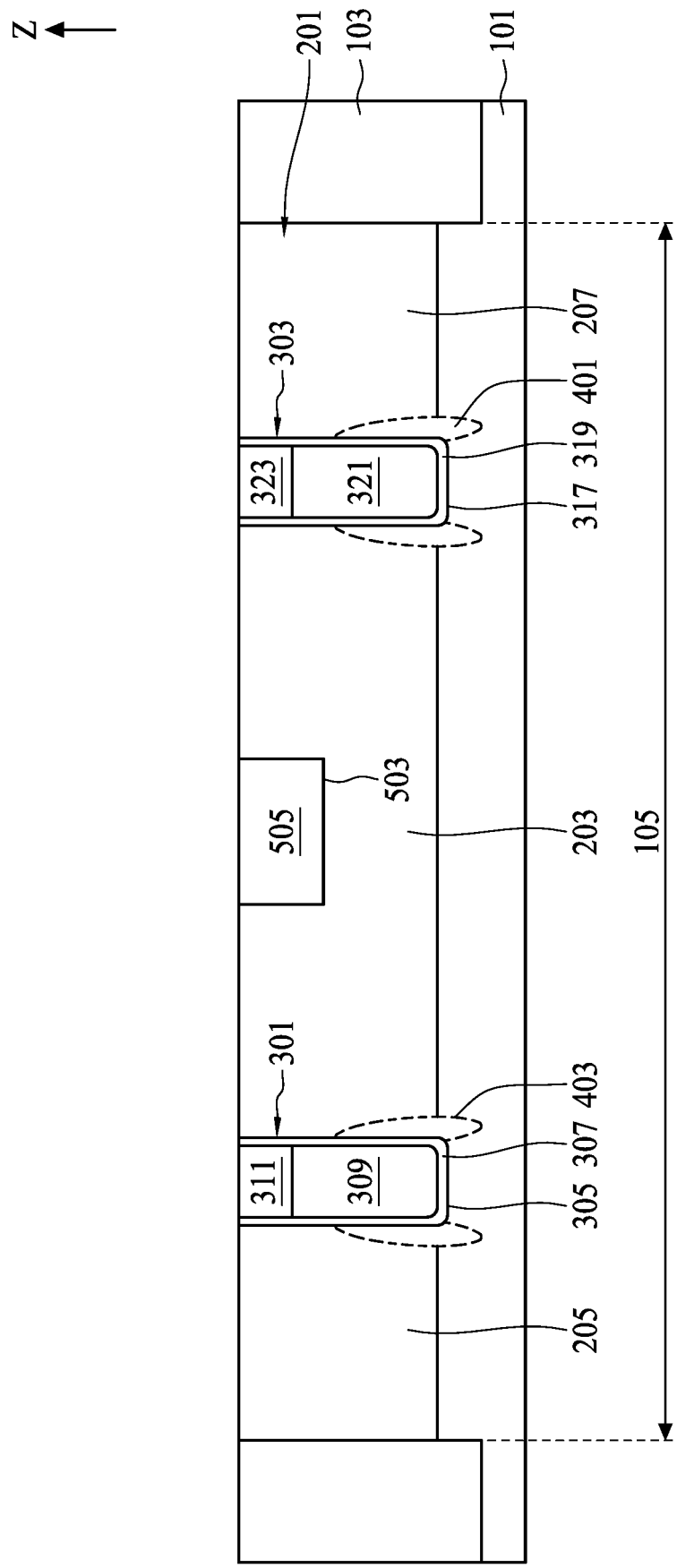

With reference to FIG. 24, a bit line contact 505 may be formed in the bit line opening 503. In the embodiment depicted, a conductive material, for example, doped polysilicon, a metal, a metal nitride, or a metal silicide may be filled into the bit line opening 503 by a metallization process. After the metallization process, a planarization process, such as chemical mechanical polishing, may be performed to remove excess filling material, provide a substantially flat surface for subsequent processing steps, and conformally form the bit line contact 505. The bit line contact 505 may be electrically connected to the first doped region 203. The metal may be, for example, aluminum, copper, tungsten, cobalt, or alloy thereof. The metal silicide may be, for example, nickel silicide, platinum silicide, titanium silicide, molybdenum silicide, cobalt silicide, tantalum silicide, tungsten silicide, or the like. A top surface of the bit line contact 505 may be at a vertical level as the same as the vertical level of the top surface of the substrate 101.

Figure 25:
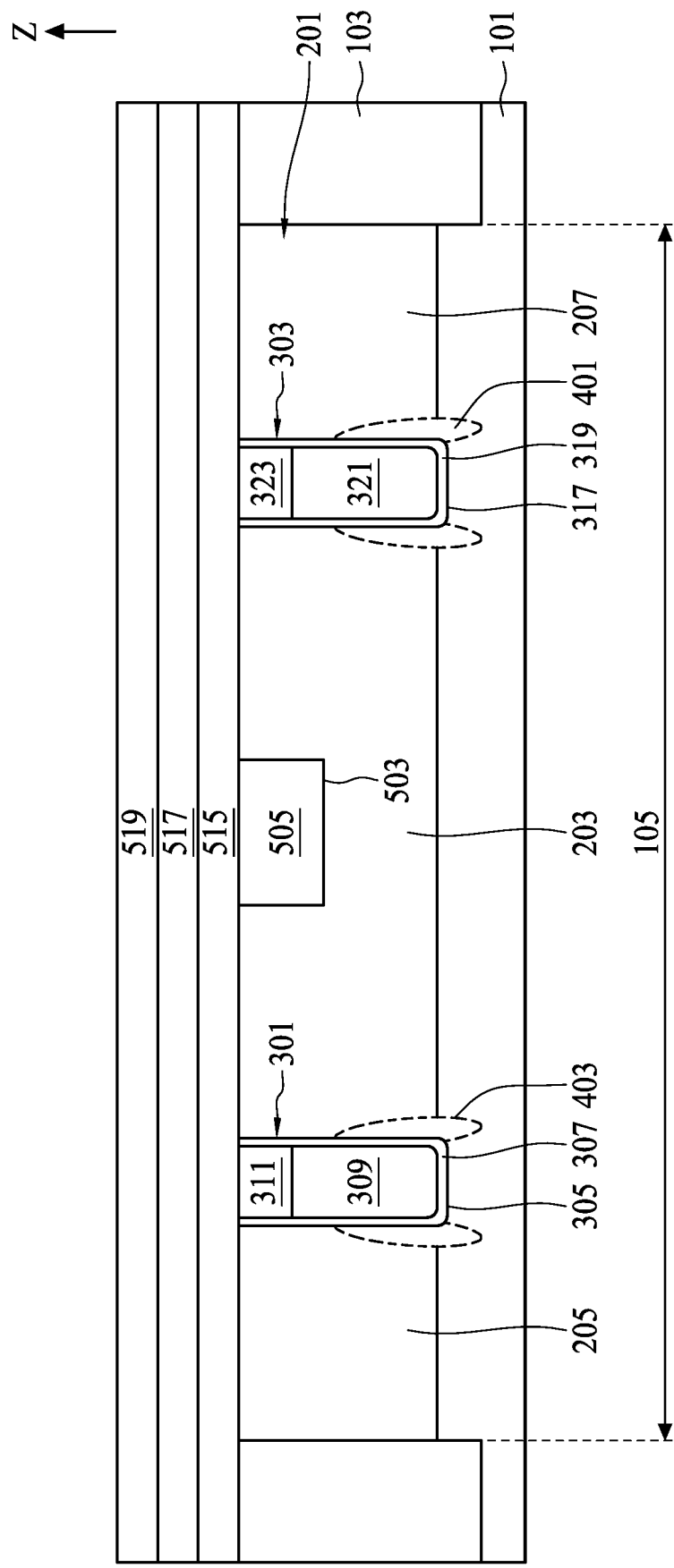

With reference to FIG. 25, a series deposition processes may be performed to sequentially deposit a bottom bit line electrode layer 515, a top bit line electrode layer 517, and a bit line capping layer 519 on the substrate 101. The bottom bit line electrode layer 515 may be formed to cover the bit line contact 505. The top bit line electrode layer 517 may be formed on the bottom bit line electrode layer 515. The bit line capping layer 519 may be formed on the top bit line electrode layer 517. The bottom bit line electrode layer 515 may be formed of, for example, doped polysilicon. The top bit line electrode layer 517 may be formed of a conductive material such as tungsten, aluminum, copper, nickel, or cobalt. The bit line capping layer 519 may be formed of, for example, silicon oxide, silicon nitride, silicon oxynitride, or silicon nitride oxide.

Figure 26:
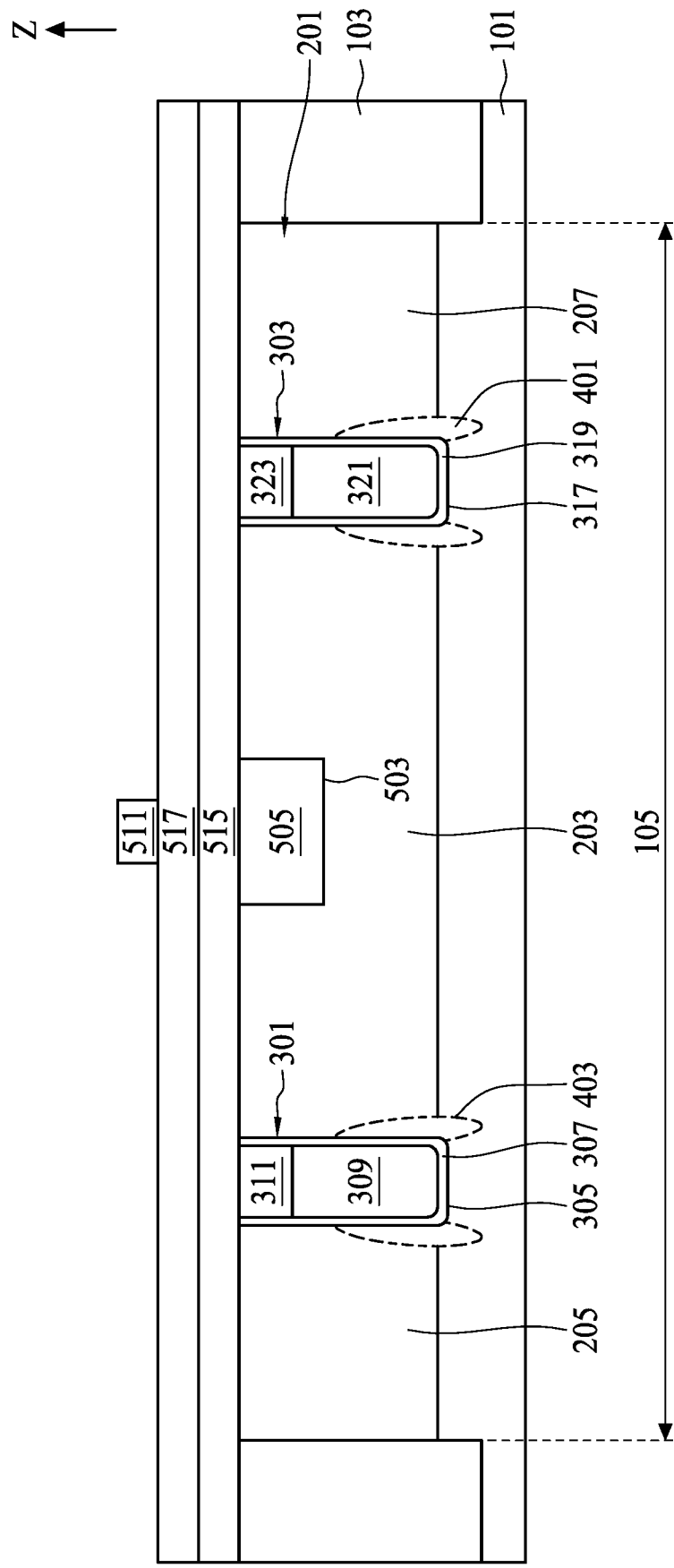

With reference to FIG. 26, a photolithography process may be performed to pattern the bit line capping layer 519 to define a position of the bit line 501. An etch process may be performed after the photolithography process to pattern the bit line capping layer 519 to a bit line mask 511. The bit line mask 511 may protect the top bit line electrode layer 517 and the bottom bit line electrode layer 515 underneath the bit line mask 511.

Figure 27:
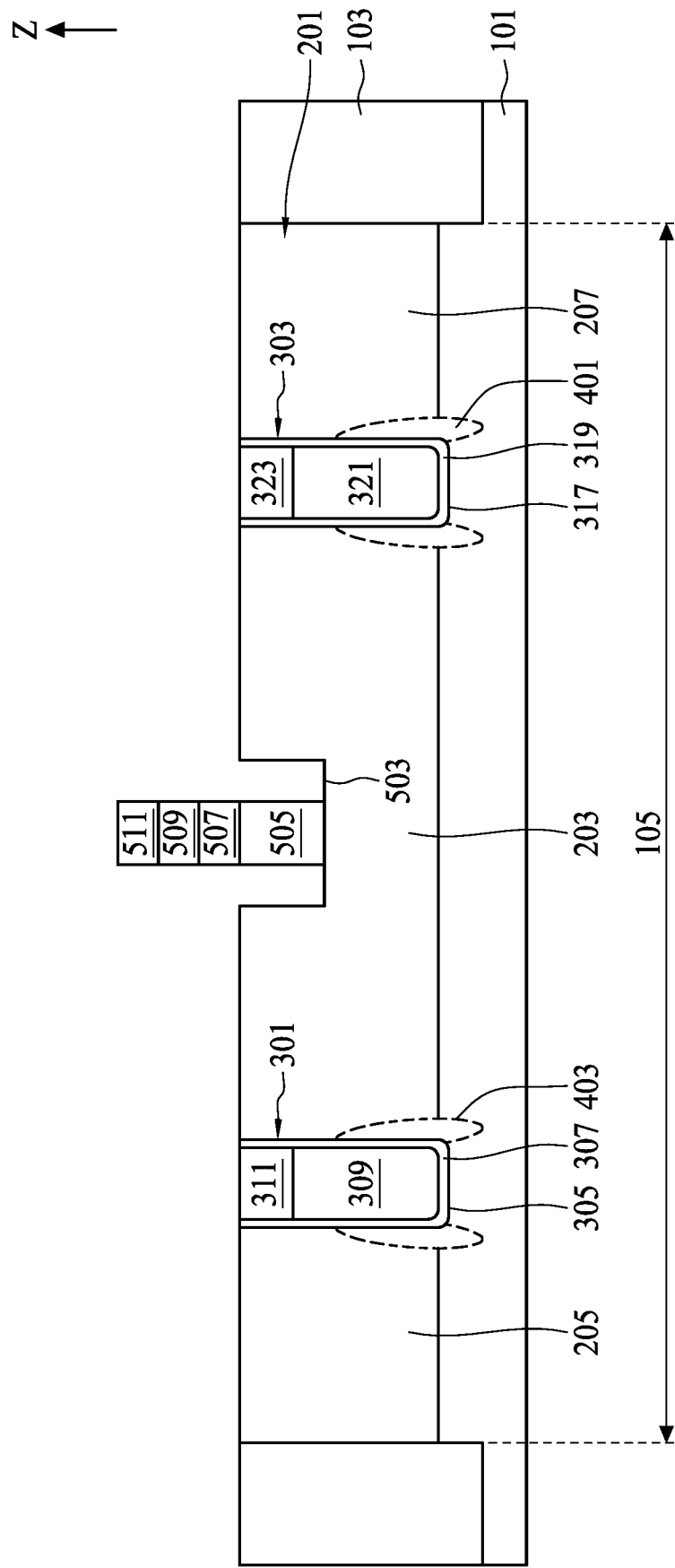

With reference to FIG. 27, an etch process, such as an anisotropic dry etch process, may be performed with the bit line mask 511 as mask. During the etch process, most of the bottom bit line electrode layer 515 and most of the top bit line electrode layer 517 may be removed, only portions of the bottom bit line electrode layer 515 and the top bit line electrode layer 517 underneath the bit line mask 511 may be retained and respectively correspondingly turn into a bit line bottom electrode 507 and a bit line top electrode 509. Portions of bit line contact 505 may be removed, in other words, widths of the bit line contact 505 may be reduced. Hence, the bit line contact 505 may be distanced from sidewalls of the bit line opening 503.

Figure 28:
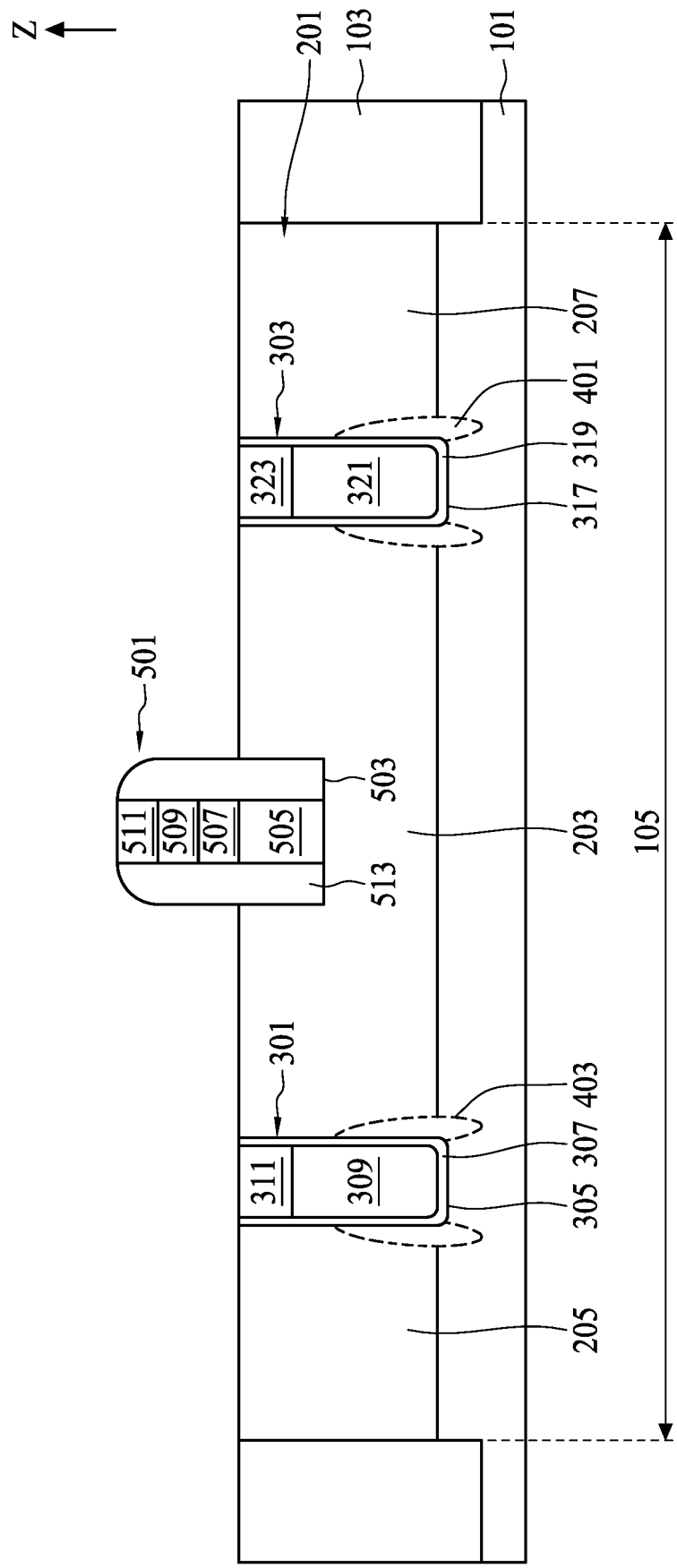

With reference to FIG. 28, a plurality of bit line spacers 513 may be respectively correspondingly formed to cover sidewalls of the bit line mask 511, sidewalls of the bit line top electrode 509, sidewalls of the bit line bottom electrode 507, and the sidewalls of the bit line contact 505. The plurality of bit line spacers 513 may fill the bit line opening 503. In the embodiment depicted, a deposition process may be performed to deposit a spacer insulating layer covered the bit line mask 511, the bit line top electrode 509, the bit line bottom electrode 507, and the bit line contact 505 and fill the bit line opening 503. After the deposit process, an etch process, such as an anisotropic dry etch process, may be performed until a top surface of the bit line mask 511 are exposed and the plurality of bit line spacers 513 may be conformally formed. The plurality of bit line spacers 513 may be formed of, for example, silicon oxide, silicon nitride, silicon oxynitride, or silicon nitride oxide.

With reference to FIG. 28, the bit line mask 511, the bit line top electrode 509, the bit line bottom electrode 507, the bit line contact 505, and the plurality of bit line spacers 513 together form the bit line 501.

Figure 29:
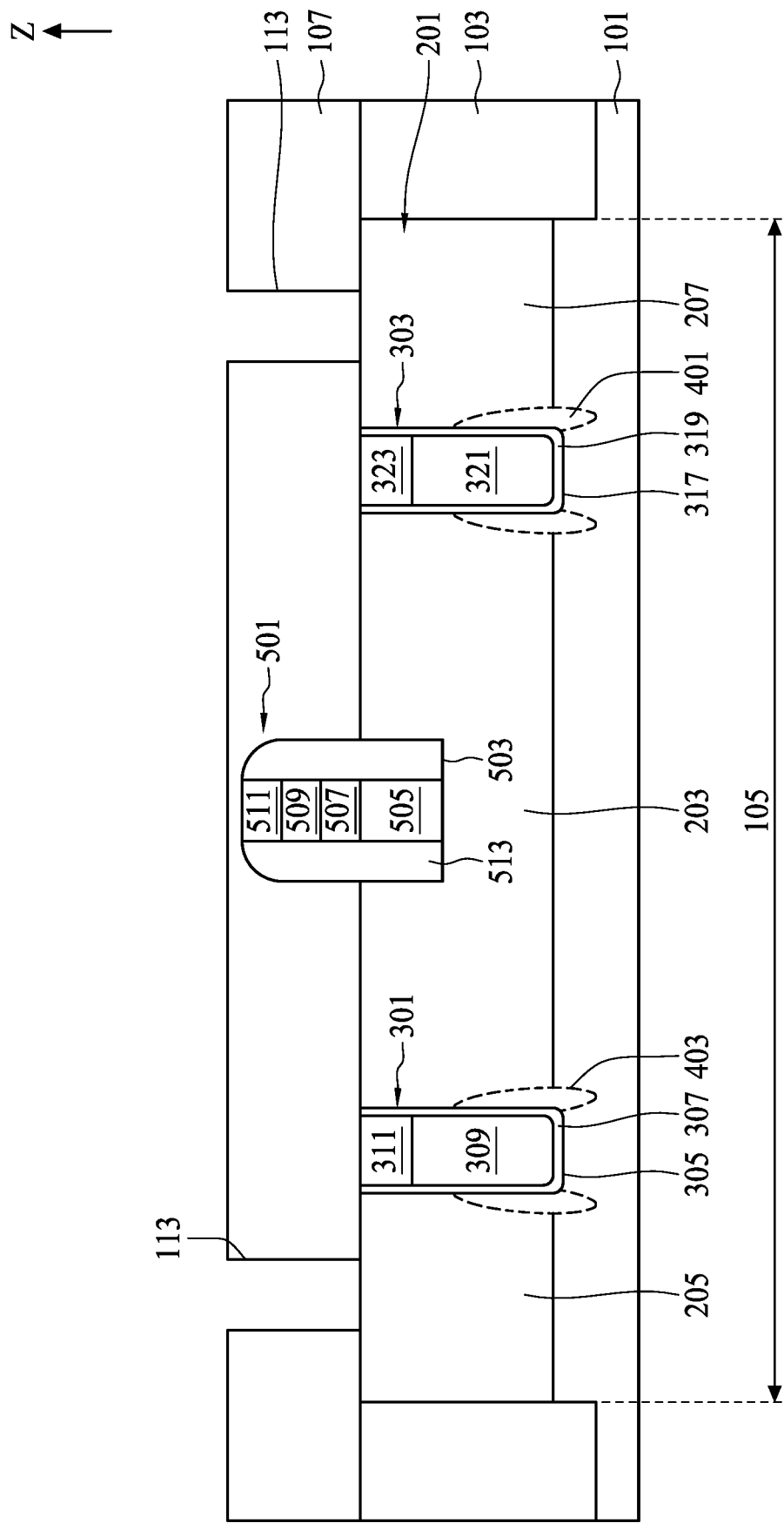
Figure 30:
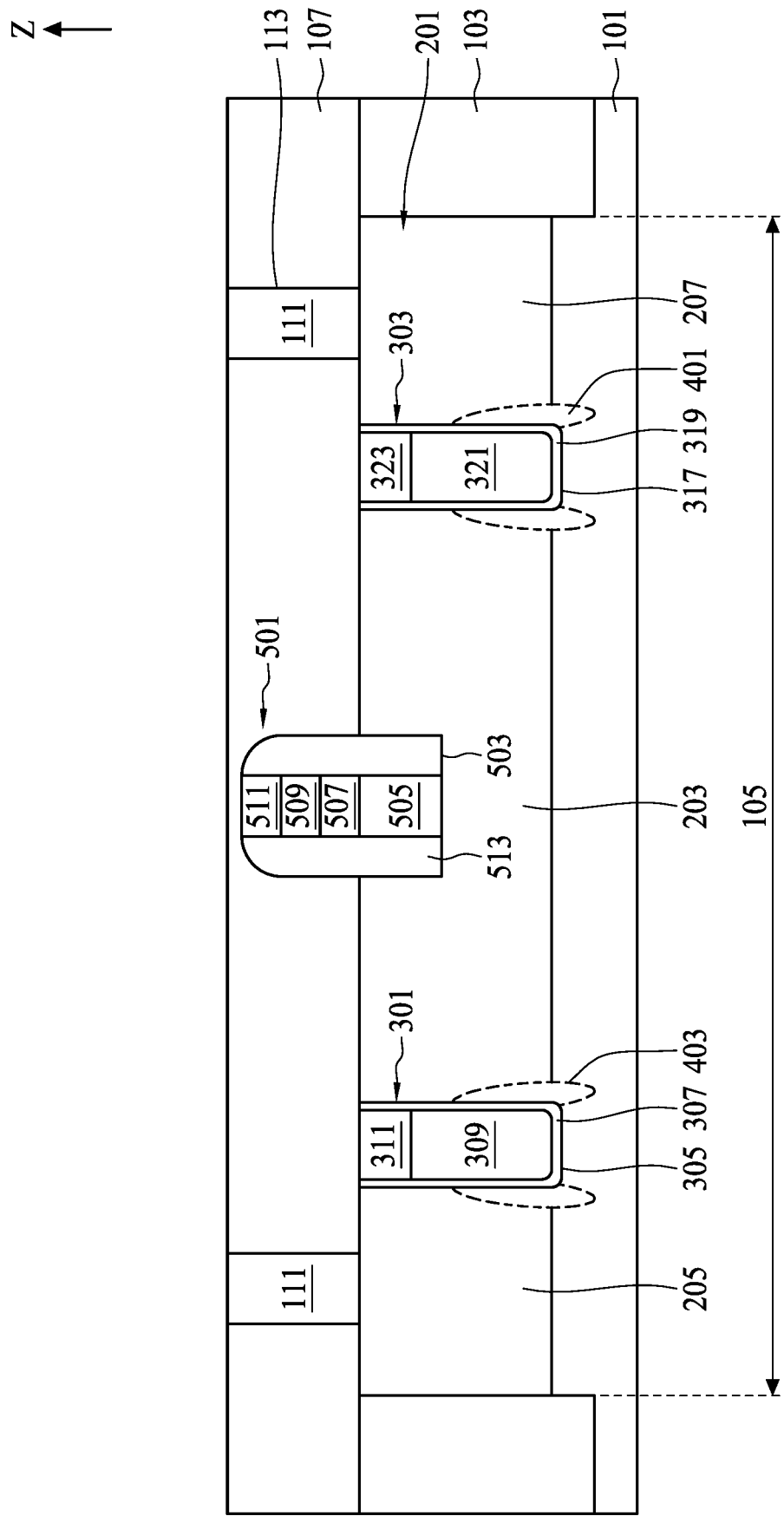

With reference to FIGS. 7, 29, and 30, at step S31, in the embodiment depicted, a plurality of conductive plugs 111 may be formed on the substrate 101. With reference to FIG. 29, a first insulating film 107 may be formed, by a deposition process, on substrate 101 and enclose the bit line 501. A planarization process, such as chemical mechanical polishing, may be optionally performed to provide a substantially flat surface for subsequent processing steps. The first insulating film 107 may be formed of for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof but is not limited thereto. After the planarization process, a photolithography process may be performed to pattern the first insulating film 107 to define positions of the plurality of conductive plugs 111. An etch process, such as an anisotropic dry etch process, may be performed after the photolithography process to form a plurality of conductive openings 113 passed the first insulating film 107.

With reference to FIG. 30, a conductive material, for example, doped polysilicon, titanium, titanium nitride, tantalum, tantalum nitride, tungsten, copper, aluminum or aluminum alloy, may be filled into the plurality of conductive openings 113 by a metallization process. After the metallization process, a planarization process, such as chemical mechanical polishing, may be performed to remove excess filling material, provide a substantially flat surface for subsequent processing steps, and conformally form the plurality of conductive plugs 111. The plurality of conductive plugs 111 may be respectively correspondingly electrically connected to the second doped region 205 and the third doped region 207.

Figure 31:
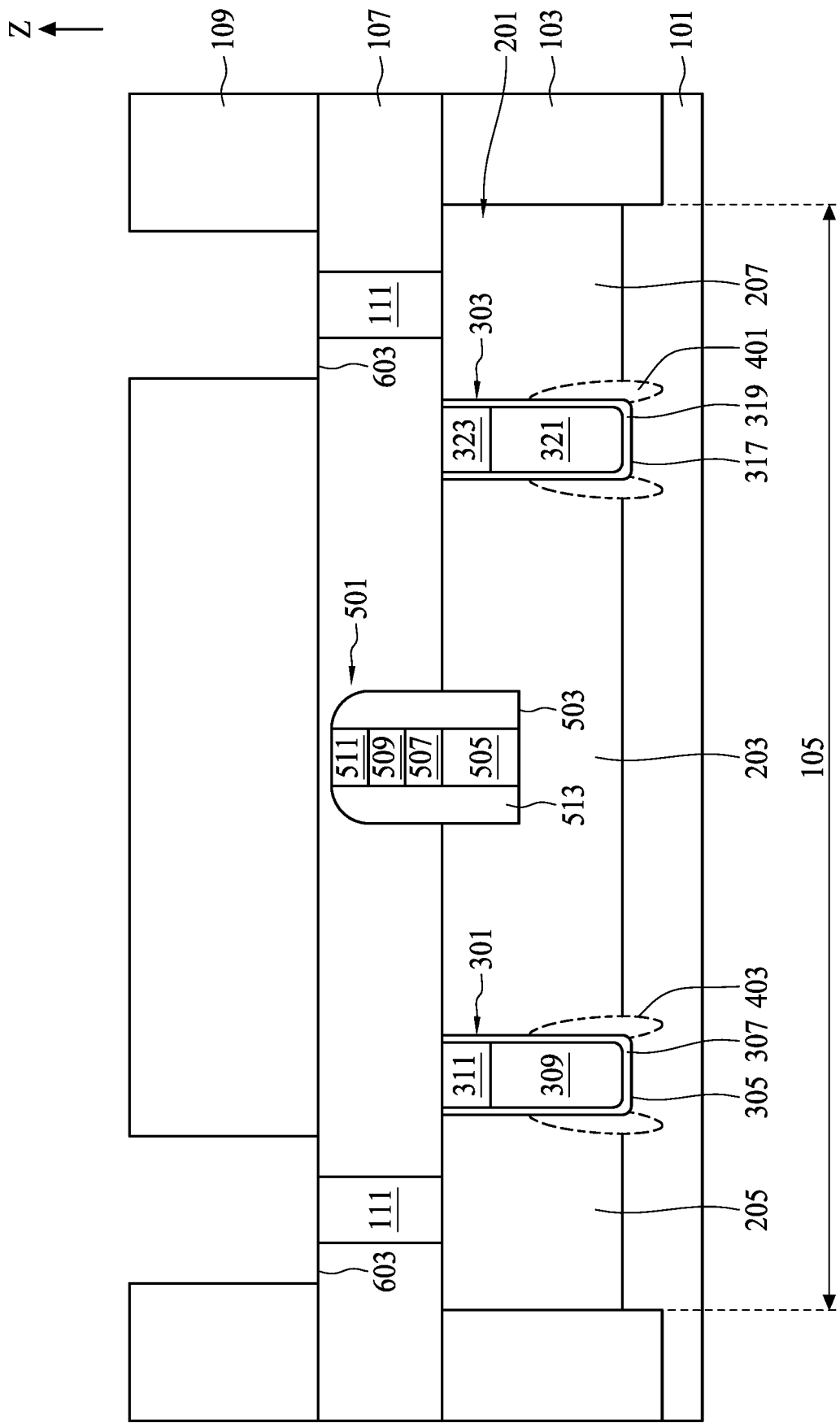

With reference to FIGS. 1, 7, and 31 to 33, at step S33, in the embodiment depicted, a plurality of capacitor structures 601 may be formed above the substrate 101. With reference to FIG. 31, a second insulating film 109 may be formed, by a deposition process, on the first insulating film 107. A planarization process, such as chemical mechanical polishing, may be optionally performed to provide a substantially flat surface for subsequent processing steps. The second insulating film 109 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. After the planarization process, a photolithography process may be performed to pattern the second insulating film 109 to define positions of the plurality of capacitor structures 601. An etch process, such as an anisotropic dry etch process, may be performed after the photolithography process to form a plurality of capacitor openings 603 in the second insulating film 109. Positions of the plurality of capacitor openings 603 may be respectively correspondingly above the plurality of conductive plugs 111.

Figure 32:
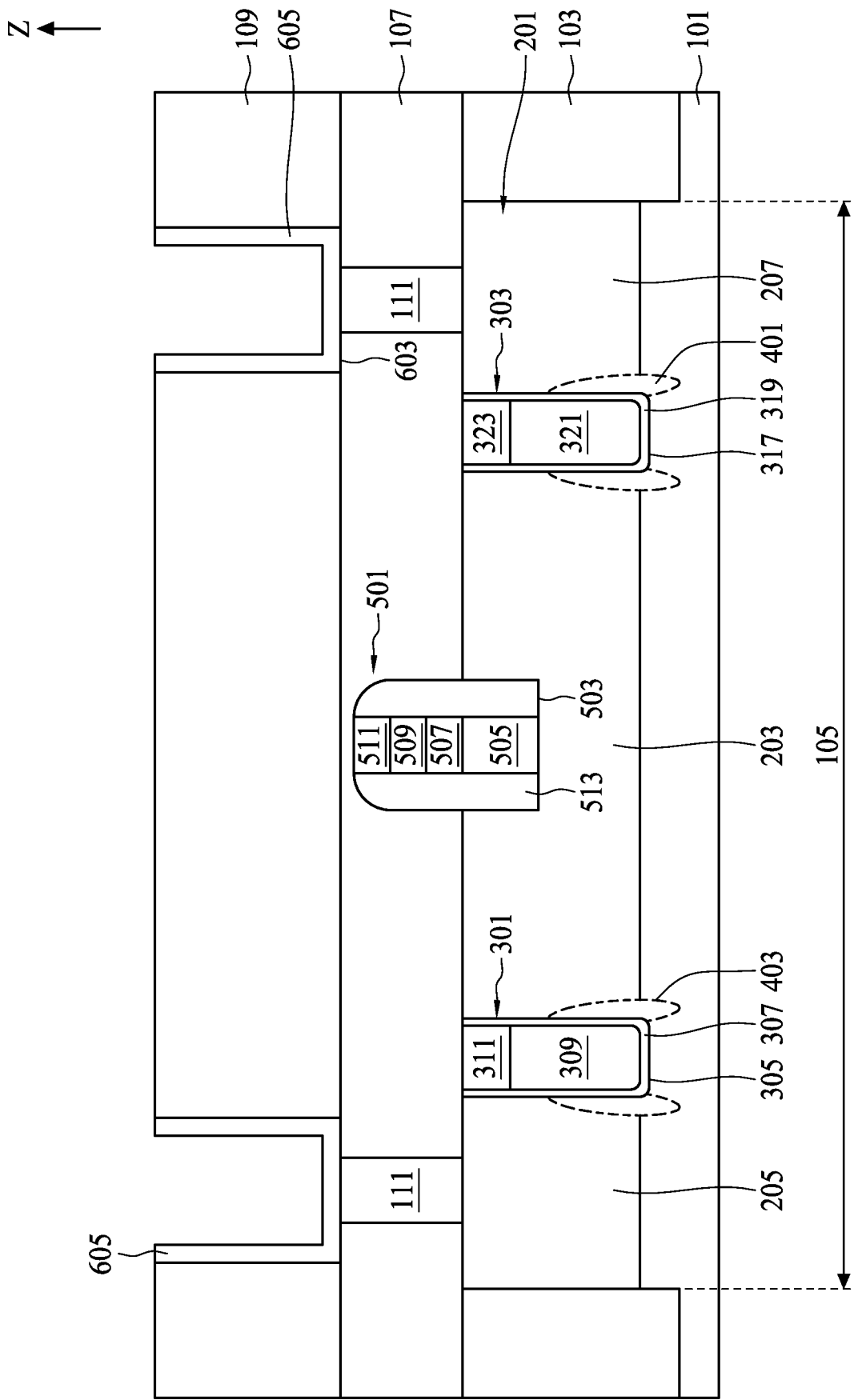

With reference to FIG. 32, a plurality of capacitor bottom electrodes 605 may be respectively correspondingly formed to conformally cover inner surfaces of the plurality of capacitor openings 603. The plurality of capacitor bottom electrodes 605 may be formed of, for example, doped polysilicon, a metal, or a metal silicide. The metal may be, for example, aluminum, copper, or tungsten. The metal silicide may be, for example, nickel silicide, platinum silicide, titanium silicide, molybdenum silicide, cobalt silicide, tantalum silicide, tungsten silicide, or the like. The plurality of capacitor bottom electrodes 605 may be respectively correspondingly connected to the plurality of conductive plugs 111.

Figure 33:
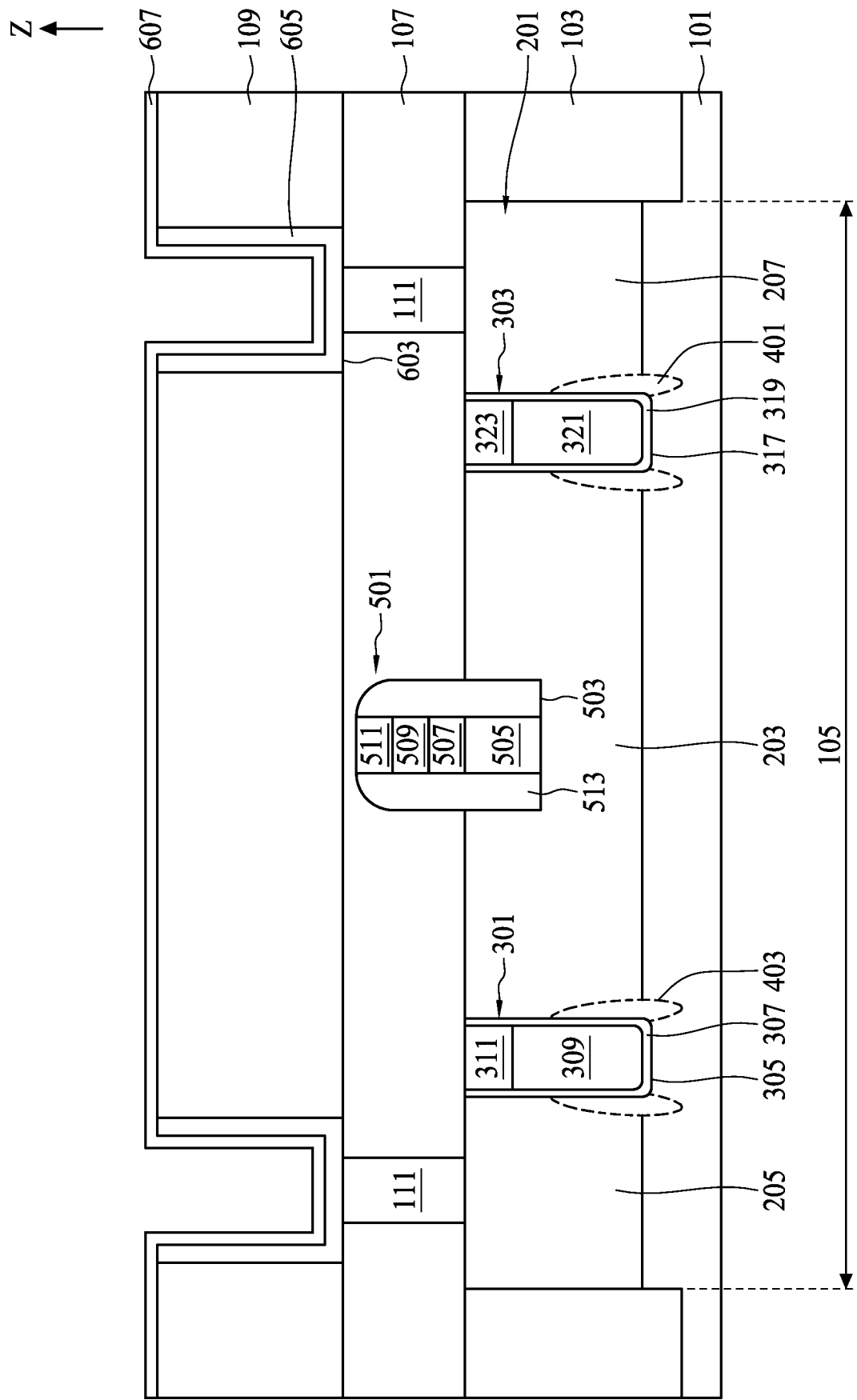

With reference to FIG. 33, a capacitor insulating layer 607 may be formed on the plurality of capacitor bottom electrodes 605 in the plurality of capacitor openings 603. The capacitor insulating layer 607 may be formed of a single layer including an insulating material having a dielectric constant of about 4.0 or greater. The insulating material may be hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, barium strontium titanate, or mixture thereof. A thickness of the capacitor insulating layer 607 may be about 1 angstrom to about 100 angstroms. Alternatively, in another embodiment depicted, the capacitor insulating layer 607 may be formed of a stacked layer consisting of silicon oxide, silicon nitride, and silicon oxide.

With reference back to FIG. 1, a capacitor top electrode 609 may be formed on the capacitor insulating layer 607. The capacitor top electrode 609 may fill the plurality of capacitor openings 603 and cover top surfaces of the capacitor insulating layer 607. The capacitor top electrode 609 may be formed of, for example, doped polysilicon, or a metal. The metal may be, for example, aluminum, copper, or tungsten.

Due to the design of the semiconductor device of the present disclosure, the second lattice constant of the plurality of stress regions 401 is different from the first lattice constant of the substrate 101; therefore, the carrier mobility of the semiconductor device may be increased; therefore, the performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating a semiconductor device, comprising:
   providing a substrate having a first lattice constant; and
   forming a first word line positioned in the substrate and a plurality of stress regions positioned adjacent to lower portions of sidewalls of the first word line;
   wherein the plurality of stress regions have a second lattice constant, the second lattice constant of the plurality of stress regions is different from the first lattice constant of the substrate;
   wherein forming a first word line positioned in the substrate and a plurality of stress regions positioned adjacent to lower portions of sidewalls of the first word line comprises:
   forming a first word line trench in the substrate;
   forming a coverage layer covered an upper portion of an inner surface of the first word line trench;
   forming a bottom mask layer on a bottom of the first word line trench;
   forming a plurality of side recesses extended outwardly at a lower portion of the inner surface of the first word line trench;
   forming the plurality of stress regions in the plurality of side recesses;
   removing the coverage layer and the bottom mask layer;
   forming a first word line insulating layer covered the inner surface of the first word line trench;
   forming a first word line electrode on the first word line insulating layer in the first word line trench; and
   forming a first word line capping layer on the first word line electrode in the first word line trench, wherein the first word line trench, the first word line insulating layer, the first word line electrode, and the first word line capping layer together form the first word line.

2. The method for fabricating the semiconductor device of claim 1, wherein bottoms of the plurality of stress regions are at a vertical level lower than a vertical level of a bottom of the first word line.

3. The method for fabricating the semiconductor device of claim 1, wherein the first word line comprises a first word line trench, a first word line insulating layer, a first word line electrode, and a first word line capping layer, the first word line trench is positioned in the substrate, the first word line insulating layer covers an inner surface of the first word line trench, the first word line electrode is positioned on the first word line insulating layer in the first word line trench, the first word line capping layer is positioned on the first word line electrode in the first word line trench, the plurality of stress regions are respectively correspondingly positioned attached to lower portions of sidewalls of the first word line insulating layer.

4. The method for fabricating the semiconductor device of claim 3, wherein the first word line capping layer is formed of a single layer including an insulating material having a dielectric constant of about 4.0 or greater.

5. The method for fabricating the semiconductor device of claim 3, wherein the first word line capping layer is formed of a stacked layer including a bottom capping layer and a top capping layer, the bottom capping layer is positioned on the first word line electrode, the top capping layer is positioned on the bottom capping layer, the bottom capping layer is formed of hafnium oxide, zirconium oxide, aluminum oxide, titanium oxide, lanthanum oxide, strontium titanate, lanthanum aluminate, yttrium oxide, gallium (III) trioxide, gadolinium gallium oxide, lead zirconium titanate, or barium strontium titanate, the top capping layer is formed of silicon oxide, silicon nitride, silicon oxynitride, silicon nitride oxide, or fluoride-doped silicate.

6. The method for fabricating the semiconductor device of claim 3, wherein sidewalls of the first word line capping layer directly contacts an upper portion of an inner surface of the first word line insulating layer.

7. The method for fabricating the semiconductor device of claim 3, wherein sidewalls of the first word line capping layer directly contacts an upper portion of the inner surface of the first word line trench.

8. The method for fabricating the semiconductor device of claim 3, wherein a bottom of the first word line trench is flat.

* * * * *